US009197221B2

(12) United States Patent
Babaie et al.

(10) Patent No.: US 9,197,221 B2
(45) Date of Patent: Nov. 24, 2015

(54) CLASS-F CMOS OSCILLATOR INCORPORATING DIFFERENTIAL PASSIVE NETWORK

(71) Applicant: Technische Universiteit Delft, Delft (NL)

(72) Inventors: Masoud Babaie, Delft (NL); Robert Bogdan Staszewski, Delft (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 14/027,635

(22) Filed: Sep. 16, 2013

(65) Prior Publication Data

US 2014/0077890 A1    Mar. 20, 2014

Related U.S. Application Data

(60) Provisional application No. 61/701,690, filed on Sep. 16, 2012, provisional application No. 61/701,695, filed on Sep. 16, 2012, provisional application No. 61/704,522, filed on Sep. 23, 2012, provisional application No. 61/829,976, filed on May 31, 2013.

(51) Int. Cl.
*H03B 5/12* (2006.01)
*H03L 7/00* (2006.01)
*H03B 7/06* (2006.01)
(Continued)

(52) U.S. Cl.
CPC .. *H03L 7/00* (2013.01); *H03B 1/00* (2013.01); *H03B 5/124* (2013.01); *H03B 5/1215* (2013.01); *H03B 5/1228* (2013.01); *H03B 5/1296* (2013.01); *H03B 7/06* (2013.01);
(Continued)

(58) Field of Classification Search
CPC ...................................... H03B 5/1215
USPC ..... 331/117 R, 117 FE, 108 A, 146, 149, 112
See application file for complete search history.

(56) References Cited

U.S. PATENT DOCUMENTS 7,649,424 B2 *  1/2010  Cusmai et al. ............ 331/117 R
8,294,528 B2 * 10/2012  Li et al. .................... 331/117 FE
(Continued)

OTHER PUBLICATIONS

E. Hegazi et al., "A 17-mW Transmitter and Frequency Synthesizer for 900-MHz GSM Fully Integrated in 0.35-um CMOS", IEEE J Solid-State Circuits, vol. 38, No. 5, May 2003, pp. 782-792.
(Continued)

*Primary Examiner* — Joseph Chang
(74) *Attorney, Agent, or Firm* — Zaretsky Patent Group PC; Howard Zaretsky

(57) ABSTRACT

A novel and useful oscillator topology demonstrating an improved phase noise performance that exploits the time-variant phase noise model with insights into the phase noise conversion mechanisms. The oscillator is based on enforcing a pseudo-square voltage waveform around an LC tank by increasing the third-harmonic of the fundamental oscillation voltage through an additional impedance peak. Alternatively, the oscillator is based on enforcing clipped oscillation waveform by increasing the second harmonic of the fundamental oscillation voltage through an additional impedance peak. This auxiliary impedance peak is realized by a transformer with moderately coupled resonating windings. As a result, the effective impulse sensitivity function (ISF) decreases thus reducing the oscillator's effective noise factor such that a significant improvement in the oscillator phase noise and power efficiency are achieved.

34 Claims, 26 Drawing Sheets

(51) Int. Cl.
*H03B 1/00* (2006.01)
*H04B 1/10* (2006.01)
*H04B 1/26* (2006.01)
*H03L 7/099* (2006.01)

(52) U.S. Cl.
CPC .......... *H03L 7/099* (2013.01); *H04B 1/10* (2013.01); *H04B 1/26* (2013.01)

(56) References Cited

U.S. PATENT DOCUMENTS

| | | | |
|---|---|---|---|
| 2010/0248647 A1* | 9/2010 | Wachi | 455/73 |
| 2011/0148535 A1* | 6/2011 | Lee | 331/117 FE |
| 2013/0063218 A1* | 3/2013 | Sadhu et al. | 331/117 FE |
| 2013/0162361 A1* | 6/2013 | Visweswaran et al. | 331/117 FE |
| 2013/0214870 A1* | 8/2013 | Mangraviti | 331/117 R |

OTHER PUBLICATIONS

R.B. Staszewski et al., "All-Digital PLL and Transmitter for Mobile Phones", IEEE J Solid-State Circ, vol. 40, No. 12, Dec. 2005, pp. 2469-2482.
L. Vercesi et al., "A Dither-Less All Digital PLL for Cellular Transmitters", IEEE J Solid-State Circ, vol. 47, No. 8, Aug. 2012, pp. 1908-1920.
H. Darabi et al., "A Quad-Band GSM/GPRS/EDGE SoC in 65 nm CMOS", IEEE J Solid-State Circ., vol. 46, No. 4, Apr. 2011, pp. 870-882.
J. Borremans et al., "A 40 nm CMOS 0.4-6 GHz Receiver Resilient to Out-of-Band Blockers", IEEE J Solid-State Circ, vol. 46, No. 7, Jul. 2011, pp. 1659-1671.
J.J. Rael et al., "Physical Processes of Phase Noise in Differential LC Oscillators", IEEE 2000 Custom IC Conference, Dec. 2000, pp. 569-572.
P. Andreani et al., "A Study of Phase Noise in Colpitts and LC-Tank CMOS Oscillators", IEEE J Solid-State Circ, vol. 40, No. 5, May 2005, pp. 1107-1118.
E. Hegazi et al., "A Filtering Technique to Lower LC Oscillator Phase Noise", IEEE J Solid-State Circ, vol. 36, No. 12, Dec. 2001, pp. 1921-1930.
A. Mazzanti et al., "Class-C Harmonic CMOS VCOs, With a General Result on Phase Noise", IEEE J Solid-State Circ, vol. 43, No. 12, Dec. 2008, pp. 2716-2729.
L. Fanori et al., "A 6.7-to-9.2GHz 55nm CMOS Hybrid Class-B/Class-C Cellular TX VCO", ISSCC 2012, Session 20, Feb. 2012, pp. 354-356.
H. Kim et al., "A Low Phase-Noise CMOS VCO With Harmonic Tuned LC Tank", IEEE Trans. on Microwave Theory and Tech., vol. 54, No. 7, Jul. 2006, pp. 2917-2924.
M. Babaie et al., "Third-Harmonic Injection Technique Applied to a 5.87- to-7.56GHz 65nm CMOS Class-F Oscillator with 192dBc/Hz FOM", ISSCC 2013, Feb. 2013, pp. 348-350.
A. Hajimiri et al., "A General Theory of Phase Noise in Electrical Oscillators", IEEE J Solid-State Circuits, vol. 33, No. 2, Feb. 1998, pp. 179-194.
B. Razavi, "A Millimeter-Wave Circuit Technique", IEEE d. Solid-State Circuits, vol. 43, No. 9, Sep. 2008, pp. 2090-2098.
J.R. Long, "Monolithic Transformers for Silicon RF IC Design", IEEE J. Solid-State Circuits, vol. 35, No. 9, Sep. 2000, pp. 1368-1382.
A. Bevilacqua et al., "Transformer-Based Dual-Mode Voltage-Controlled Oscillators", IEEE Trans. Circuits and Systems, vol. 54, No. 4, Apr. 2007, pp. 293-297.
A. Goel et al., "Frequency Switching in Dual-Resonance Oscillators", IEEE J. Solid-State Circuits, vol. 42, No. 3, Mar. 2007, pp. 571-582.
B. Razavi, "Cognitive Radio Design Challenges and Techniques", IEEE J. Solid-State Circuits, vol. 45, No. 8, Aug. 2010, pp. 1542-1553.
G. Li et al., "A Low-Phase-Noise Wide-Tuning-Range Oscillator Based on Resonant Mode Switching", IEEE J. Solid-State Circuits, vol. 47, No. 6, Jun. 2012, pp. 1295-1308.
R. Degraeve et al., "A New Model for the Field Dependence of Intrinsic and Extrinsic Time-Dependent Dielectric Breakdown", IEEE Trans Elect Devices, vol. 45, No. 2, Feb. 1998, pp. 472-481.
M. Babaie et al., "A Study of RF Oscillator Reliability in Nanoscale CMOS", Delft University of Technology, Sep. 2013.
B. Razavi, "A Study of Phase Noise in CMOS Oscillators", IEEE J. Solid-State Circuits, vol. 31, No. 3, Mar. 1996, pp. 331-343.
H. Krishnaswamy et al., "Inductor-and Transformer-based Integrated RF Oscillators:A Comparative Study", IEEE 2006 Custom IC Conference, Sep. 2006, pp. 381-384.
P. Andreani et al., "Misconception regarding use of transformer resonators in monolithic oscillators", Electronic Letters, vol. 42, No. 7, Mar. 30, 2006.
D. Murphy et al., "Phase Noise in LC Oscillators: A Phasor-Based Analysis of a General Result and of Loaded 0", IEEE Trans Circuits Systems, vol. 57, No. 6, Jun. 2010, pp. 1187-1203.
L. Fanori et al., "Low-Phase-Noise 3.4-4.5 GHz Dynamic-Bias Class-C CMOS VCOs with a FoM of 191 dBc/Hz", IEEE, Mar. 2012, pp. 406-409.
P. Andreani et al., "More on the 1/f2 Phase Noise Performance of CMOS Differential-Pair LC-Tank Oscillators", IEEE J. Solid-State Circ, vol. 41, No. 12, Dec. 2006, pp. 2703-2712.
J. Groszkowski, "The Interdependence of Frequency Variation and Harmonic Content, and the Problem of Constant-Frequency Oscillations", Proceedings of the Institute of Radio Engineers, vol. 21, No. 7, Jul. 1933, pp. 958-981.
A, Bevilacqua et al,, "An Analysis of 1/f Noise to Phase Noise Conversion in CMOS Harmonic Oscillators", IEEE Trans Circ Syst, vol. 59, No. 5, May 2012, pp. 938-945.
A. Visweswaran et al., "A Clip-and-Restore Technique for Phase Desensitization in a 1.2V 65nm CMOS Oscillator for Cellular Mobile and Base Stations", ISSCC 2012, Feb. 2012, pp. 350-352.
J. Steinkamp et al., "A Colpitts Oscillator Design for a GSM Base Station Synthesizer", IEEE Radio Freqrency Integrated Circuits Symposium, Sep. 2007, pp. 405-408.

\* cited by examiner

US 9,197,221 B2

CLASS-F CMOS OSCILLATOR INCORPORATING DIFFERENTIAL PASSIVE NETWORK

REFERENCE TO PRIORITY APPLICATION

This application claims priority to U.S. Provisional Application Ser. No. 61/701,690, filed Sep. 16, 2012, entitled "Digitally Intensive Transceiver," U.S. Provisional Application Ser. No. 61/701,695, filed Sep. 16, 2012, entitled "Class-F Oscillator," U.S. Provisional Application Ser. No. 61/704,522, filed Sep. 23, 2012, entitled "RF Transceiver," and U.S. Provisional Application Ser. No. 61/829,976, filed May 31, 2013, entitled "Time Domain RF Signal Processing," all of which are incorporated herein by reference in their entirety.

FIELD OF THE INVENTION

The present invention relates to the field of semiconductor integrated circuits, and more particularly relates to a CMOS based class-F oscillator topology.

BACKGROUND OF THE INVENTION

Designing voltage-controlled and digitally-controlled oscillators (VCO, DCO) of high spectral purity and low power consumption is quite challenging, especially for a GSM transmitter (TX), where the oscillator phase noise is required to be less than −162 dBc/Hz at 20 MHz offset frequency from the 915 MHz carrier. At the same time, the RF oscillator consumes a disproportionate amount of power of an RF frequency synthesizer and consumes more than 30% of the cellular RX power. Consequently, any power reduction of RF oscillators will greatly benefit the overall transceiver power efficiency and ultimately the battery lifetime.

In an oscillator, the phase noise depends on the quality factor (Q) of its LC tank, its oscillation voltage swing and its effective noise factor. The Q-factor at wireless cellular carrier frequencies is usually limited by the inductor due to physical constraints on the width and thickness of the metal and the substrate loss in bulk CMOS and does not change too much when migrating to advanced CMOS technologies.

On the other hand, the oscillation voltage swing is limited by the supply voltage $V_{DD}$, which keeps on reducing in the advanced CMOS technology. In addition, increasing the oscillation voltage stops improving the phase noise when the gm-devices enter the triode region. Furthermore, the excess noise factor of the transistors is increased resulting in larger noise factor for the oscillator. Consequently, the phase noise and power efficiency of the traditional RF CMOS oscillator reduce by migrating to more advanced technologies. Prior art oscillators suffer from inadequate phase noise performance, clip-and-restore DCO due to use of two transformers (die area penalty) and large gate oxide swings (reliability issues); and die area penalties of utilizing an extra inductor as well as large $V_{DD}$=2.5 V (noise-filtering oscillators).

There is thus a need to increase the power efficiency of an RF oscillator while meeting the strict phase noise requirements of the cellular standards with sufficient margin and abiding by the process technology reliability rules.

SUMMARY OF THE INVENTION

A novel and useful oscillator topology demonstrating an improved phase noise performance that exploits the time-variant phase noise model with insights into the phase noise conversion mechanisms. The oscillator is based on enforcing a pseudo-square voltage waveform around an LC tank by increasing the third-harmonic of the fundamental oscillation voltage through an additional impedance peak. This auxiliary impedance peak is realized by a transformer with moderately coupled resonating windings. As a result, the effective impulse sensitivity function (ISF) decreases thus reducing the oscillator's effective noise factor such that a significant improvement in the oscillator phase noise and power efficiency are achieved.

In the oscillator of the present invention, the oscillation voltage around the tank is a square-wave instead of a sinusoidal. As a consequence, the oscillator exploits the special ISF properties of the square-wave oscillation voltage to achieve better phase noise and power efficiency. The gm-devices, however, work in the triode region even longer than in the case of the sinusoidal oscillator. Hence, the transistors provide a discharge path between the output node and ground, thus deteriorating the equivalent Q-factor of the tank. Consequently, the resonator and gm-device inject more noise to the tank. Nevertheless, ISF value is expected to be negligible in this time span due to the zero derivative of oscillation voltage.

Although the circuit injects huge amount of noise to the tank, the noise cannot change the phase of the oscillation voltage and thus there is no phase noise degradation. The square-wave oscillation voltage can effectively desensitize the oscillator phase noise to the circuit noise and significantly improve the RF oscillator performance and its power efficiency.

An advantage of the oscillator of the present invention is that the effective noise factor of the oscillator is decreased at least by a factor of two:

(1) The ISF rms squared can reach values as low as ½ of the traditional oscillators, which translates to a 3 dB phase noise and FoM improvement compared to prior art oscillators. Furthermore, the ISF of the oscillator is negligible while the circuit injects significant amount of noise to the tank. Consequently, the oscillator FoM improvement is larger than that predicted by just the ISF rms reduction.

(2) The class-F operation demonstrates sharper zero-crossing transitions (at the same supply voltage) as compared to the other oscillator classes. This is due to the tank voltage gain at the gate and contribution of the $3^{rd}$ harmonic in the drain oscillation voltage. The oscillator exhibits the superior phase noise performance along with high power efficiency.

A comprehensive study of circuit-to-phase-noise conversion mechanisms of different oscillators' structures shows the class-F oscillator exhibits the lowest phase noise at the same tank's quality factor and supply voltage. In one example embodiment, the class-F oscillator is implemented in TSMC 65-nm standard CMOS. It exhibits average phase noise of −136 dBc/Hz at 3 MHz offset from the carrier over 5.9 to 7.6 GHz tuning range with figure of merit of 192 dBc/Hz. The oscillator occupies 0.12 mm² while drawing 12 mA from a 1.25 V supply.

There is thus provided in accordance with the invention, an oscillator circuit, comprising an active network having an input and an output, said active network operative to generate an active signal, a passive network having an input and an output, said passive network coupled to said active network and operative to generate a passive signal coupled to said active network input, and wherein said passive network has a first input impedance peak at a first frequency $f_1$ and a second input impedance peak at a second frequency $f_2$.

There is also provided in accordance with the invention, an oscillator circuit, comprising a pair of transistors, said transistors each having a gate terminal and a drain terminal, a transformer comprising a primary winding and a secondary winding, said primary winding coupled to said drain terminals of said transistors, said secondary winding coupled to said gate terminals of said transistors, a first tunable capacitor coupled to said primary transformer winding, a second tunable capacitor coupled to said secondary transformer winding.

There is further provided in accordance with the invention, an oscillator circuit, comprising an active network having an input and an output, said active network operative to generate an active signal, a tank circuit coupled to said active network and operative to generate a signal coupled to said active network input, and wherein said tank circuit has a first resonant frequency and a second resonant frequency.

There is also provided in accordance with the invention, a method of implementing an oscillator, the method comprising providing an active network having an input and an output, said active network operative to generate an active signal, providing a tank circuit coupled to said active network, said tank circuit having a first resonant frequency and generating a signal coupled to said active network input, increasing a substantially third harmonic component of a fundamental frequency in said tank circuit through a second resonant frequency thereof.

There is further provided in accordance with the invention, a method of implementing an oscillator, the method comprising providing an active network having an input and an output, said active network operative to generate an active signal, providing a tank circuit coupled to said active network, said tank circuit having a first resonant frequency and generating a signal coupled to said active network input, increasing a substantially second harmonic component of a fundamental frequency in said tank circuit through a second resonant frequency thereof.

There is also provided in accordance with the invention, an oscillator circuit, comprising a resonating transformer for filtering and voltage amplifying a driving voltage waveform, and an inverter coupled to said resonating transformer and configured to generate said driving voltage waveform.

BRIEF DESCRIPTION OF THE DRAWINGS

The invention is herein described, by way of example only, with reference to the accompanying drawings, wherein.

DETAILED DESCRIPTION OF THE INVENTION

The present invention is a high spectral purity and high power efficiency RF CMOS oscillator having applications in up/down conversion of desired baseband data to radio frequencies. The oscillator is a vital and essential building block of wireless or wireline communication systems. RF oscillators typically consume disproportionate amounts of power of an RF frequency synthesizer and burn more than 30% of the cellular RX power. The RF oscillator of the present invention exhibits reduced power consumption thereby greatly benefiting the overall transceiver power efficiency and battery lifetime.

The oscillation waveform of the RF CMOS oscillator of the present invention is pseudo-square across its LC tank rather than sinusoidal. It decreases the circuit-to-phase noise conversion of the oscillators meaning the oscillator exhibits improved power efficiency compared to prior art oscillator structures at the same phase noise performance. This translates directly to longer battery life. In addition, the oscillator exhibits higher spectral purity at the same power consumption compared to prior art oscillator structures which increases the production yield due to a larger margin with respect to the standard requirement and improves the receiver noise figure and its robustness to out of band interference.

Figure 1A:
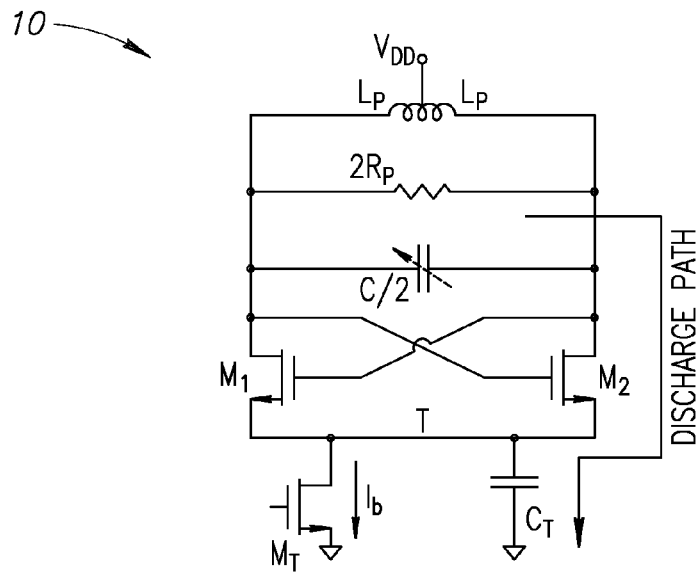
FIG. 1A is a diagram illustrating an example oscillator circuit and associated noise sources.
Figure 1B:
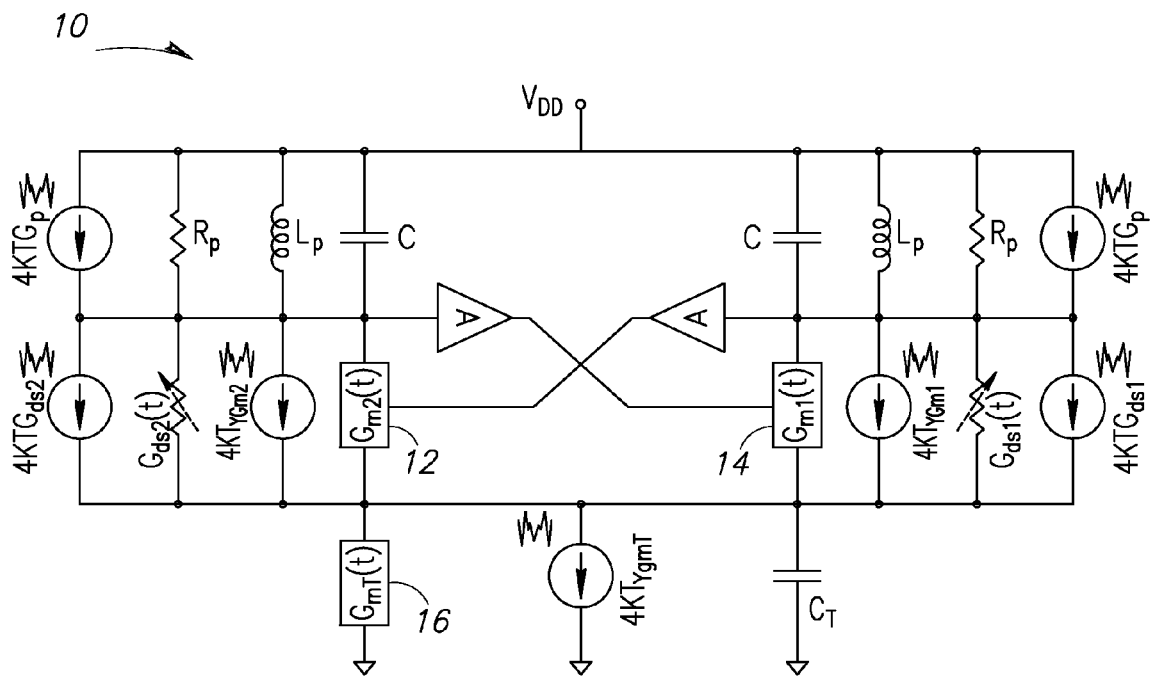
FIG. 1B is a diagram illustrating the associated noise sources of the oscillator of FIG. 1A.
Figure 1C:
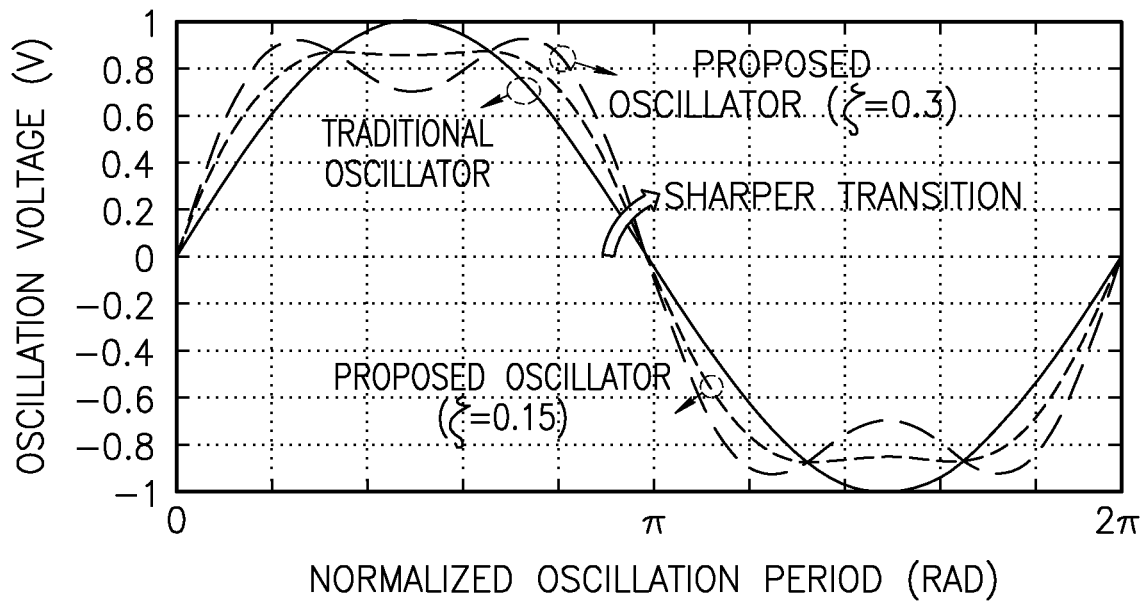
FIG. 1C is a diagram illustrating the effect of adding $3^{rd}$ harmonic in the oscillation waveform (top) and its expected impulse sensitivity function (ISF) (bottom)
Figure 1C:
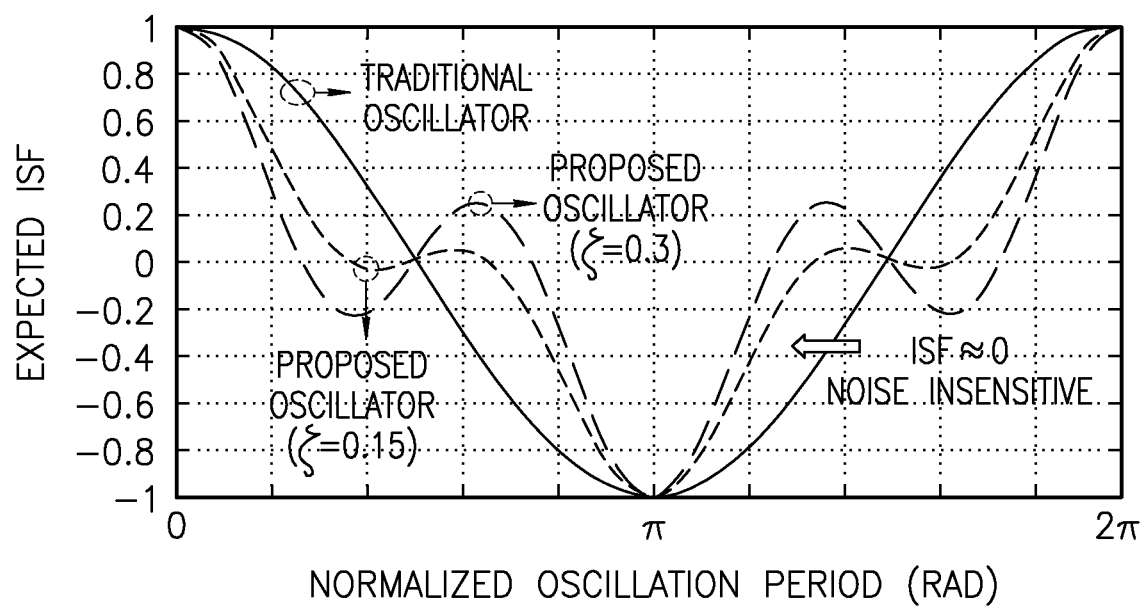

A diagram illustrating an example oscillator circuit is shown in FIG. 1A. A diagram illustrating the associated noise sources of the oscillator is shown in FIG. 1B. The oscillator, generally referenced 10, comprises a tank circuit 24 including inductors $L_P$, capacitors C and resisters $R_P$ (for purposes only of modeling the tank losses), transistors $M_1$ 14, $M_2$ 12, $M_T$ 16. The traditional class-B oscillator shown in FIG. 1A is the most prevalent architecture due its simplicity and robustness. Its phase noise and power efficiency performance, however, drops dramatically just by replacing the ideal current source with a real one. The traditional oscillator reaches its best performance for the oscillation amplitude of near supply voltage $V_{DD}$. Therefore, the gm-devices $M_{1/2}$ enter the deep triode region for part of the oscillation period where they exhibit a few tens of ohms of channel resistance.

In addition, the tail capacitor $C_T$ should be large enough to filter out thermal noise of $M_T$ around the even harmonics of the fundamental, thus making a low impedance path between node "T" and ground. Consequently, the tank output node finds a discharge path to the ground. This means that the equivalent Q-factor of the tank is degraded dramatically. This event happens alternatively between $M_1$ and $M_2$ transistors in each oscillation period. Hence, the phase noise improvement would be negligible by increasing the oscillation voltage swing when the gm-devices enter the triode region and thus the figure of merit (FoM) drops dramatically. This degradation seems rather unavoidable in the structure of FIG. 1A since $M_T$ must anyway be very large to reduce the 1/f3 phase noise corner of the oscillator and thus its parasitic capacitor alone would be large enough to provide a discharge path for the tank during the gm-device triode region operation.

Applying a noise filtering technique provides a relatively high impedance between the gm-devices and the current source. Hence, the structure maintains the intrinsic Q-factor of the tank during the entire oscillation period. It requires, however, an extra resonator sensitive to parasitic capacitances, increasing the design complexity, area and cost.

A class-C oscillator (not shown) prevents the gm-devices from entering the triode region. Hence, the tank Q-factor is preserved throughout the oscillation period. The oscillator also benefits with 36% power saving from changing the drain current shape from a square-wave of the traditional oscillator to the tall and narrow form for class-C operation. The constraint of avoiding entering the triode region, however, limits the maximum oscillation amplitude of the class-C oscillator to around $V_{DD}/2$, for the case of bias voltage $V_B$ as low as a threshold voltage of the active devices. This translates to 6 and 3 dB phase noise and FoM penalty, respectively. Consequently, class-C voltage swing constraint limits the lowest achievable phase noise performance.

A harmonic tuning oscillator enforces a pseudo-square voltage waveform around the LC tank by increasing the third-harmonic component of the fundamental oscillation voltage through an additional tank impedance peak at that frequency. This technique improves the phase noise performance of the LC oscillator by increasing the oscillation zero-crossings slope. Such a structure, however, requires more than two separate LC resonators to make the desired tank input impedance, increases die area and cost penalty and decreases tuning range due to more parasitics. Furthermore, the oscillator transconductance loop gain is the same for both resonant frequencies thus raising the probability of undesired oscillation at the auxiliary tank input impedance. The oscillator of the present invention overcomes the above mentioned concerns and improves the phase noise and power efficiency of the class-F oscillator compared to other structures.

Consider the oscillation voltage around the tank as a square-wave instead of a sinusoidal. As a consequence, the oscillator exploits the special ISF properties of the square-wave oscillation voltage to achieve better phase noise and power efficiency. The gm-devices, however, work in the triode region even longer than in case of the sinusoidal oscillator. Hence, the loaded resonator and gm-device inject more noise into the tank. Nevertheless, ISF value is expected to be negligible in this time span due to the zero derivative of the oscillation voltage. Although the circuit injects a huge amount of noise into the tank, the noise does not change the phase of the oscillation voltage and thus there is no phase noise degradation.

Figure 2:
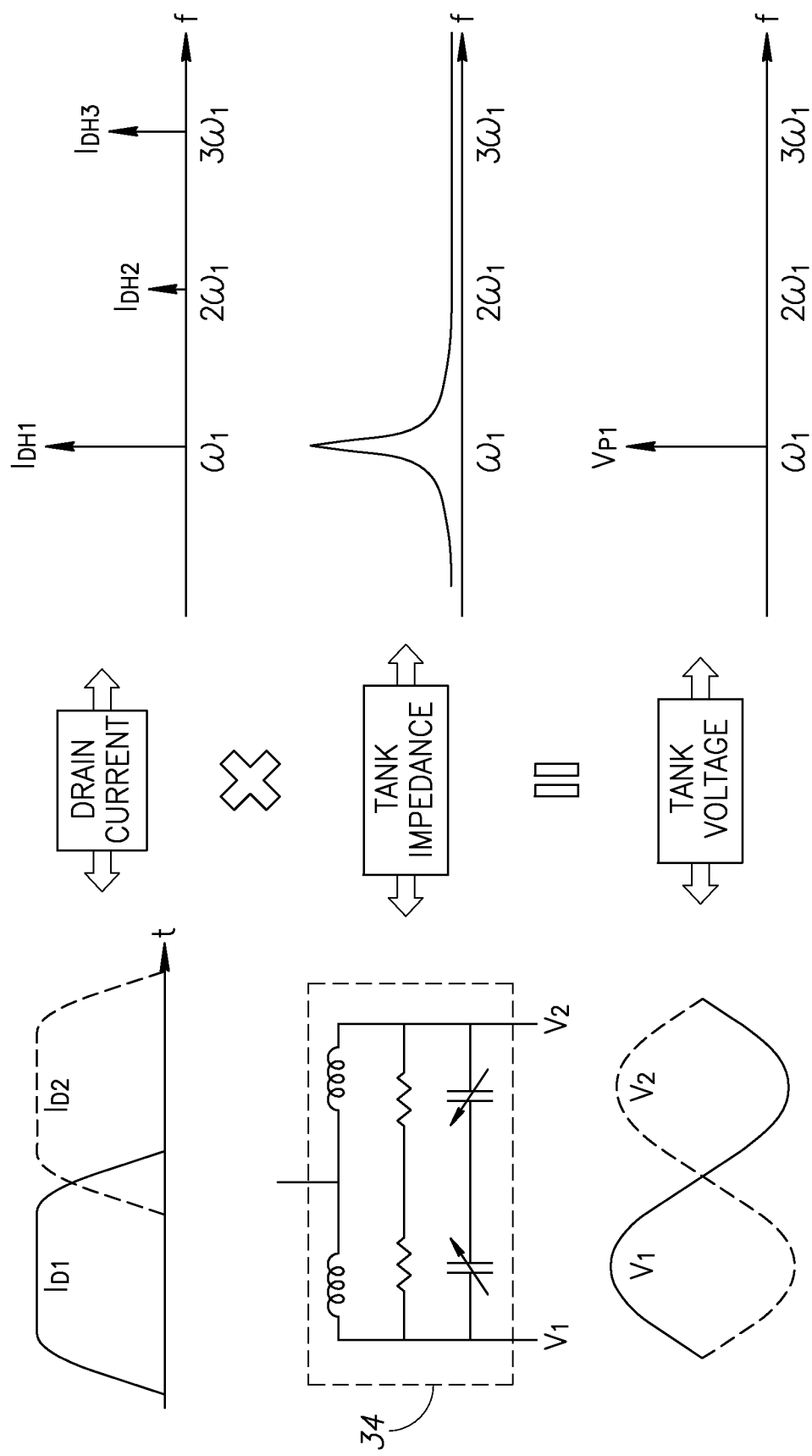
FIG. 2 is a diagram illustrating conventional oscillator waveforms in the time and frequency domains.

The above reasoning indicates that the square wave oscillation voltage has special ISF properties that are beneficial for the oscillator phase noise performance. Let us take a closer look at the conventional oscillator in the frequency domain. As shown in FIG. 2, the drain current of a typical LC-tank oscillator is approximately a square-wave. Hence, it ideally has fundamental and odd harmonic components. On the other hand, the tank input impedance has a magnitude peak only at the fundamental frequency. Therefore, the tank filters out the harmonic components of the drain current and finally a sinusoidal wave is seen across the tank. Now suppose the tank offers another input impedance magnitude peak around the third harmonic of the fundamental frequency (see FIG. 3). The tank is prevented from filtering out the $3^{rd}$ harmonic component of the drain current. Consequently, the oscillation voltage contains a significant amount of the $3^{rd}$ harmonic component in addition to the fundamental:

$$V_{in} = V_{p1} \sin(\omega_0 t) + V_{p3} \sin(3\omega_0 t + \Delta\phi) \quad (1)$$

$\zeta$ is defined as the magnitude ratio of the third-to-first harmonic components of the oscillation voltage.

$$\zeta = \frac{V_{p3}}{V_{p1}} = \left(\frac{R_{p3}}{R_{p1}}\right)\left(\frac{I_{DH3}}{I_{DH1}}\right) \approx 0.33\left(\frac{R_{p3}}{R_{p1}}\right) \quad (2)$$

where, $R_{p1}$ and $R_{p3}$ are the tank impedance magnitudes at the main resonant frequency $\omega_1$ and $3\omega_1$, respectively. The ISF rms value of the proposed oscillation waveform can be estimated by the following expression for $-\pi/8 < \Delta\phi < \pi/8$.

$$\Gamma_{rms}^2 = \frac{1}{2} \frac{1+9\zeta^2}{(1+3\zeta)^2} \quad (3)$$

The waveform would become a sinusoidal for the extreme case of $\zeta=0, \infty$ so (3) predicts $\Gamma_{rms}^2=1/2$, which is well-known for the traditional oscillators. $\Gamma_{rms}^2$ reaches its lowest value of 1/4 for $\zeta=1/3$, translated to a 3 dB phase noise and FoM improvement compared to the traditional oscillators. Furthermore, the ISF of the proposed oscillator is negligible while the circuit injects significant amount of noise to the tank. Consequently, the oscillator FoM improvement could be larger than that predicted by just the ISF rms reduction.

Figure 3:
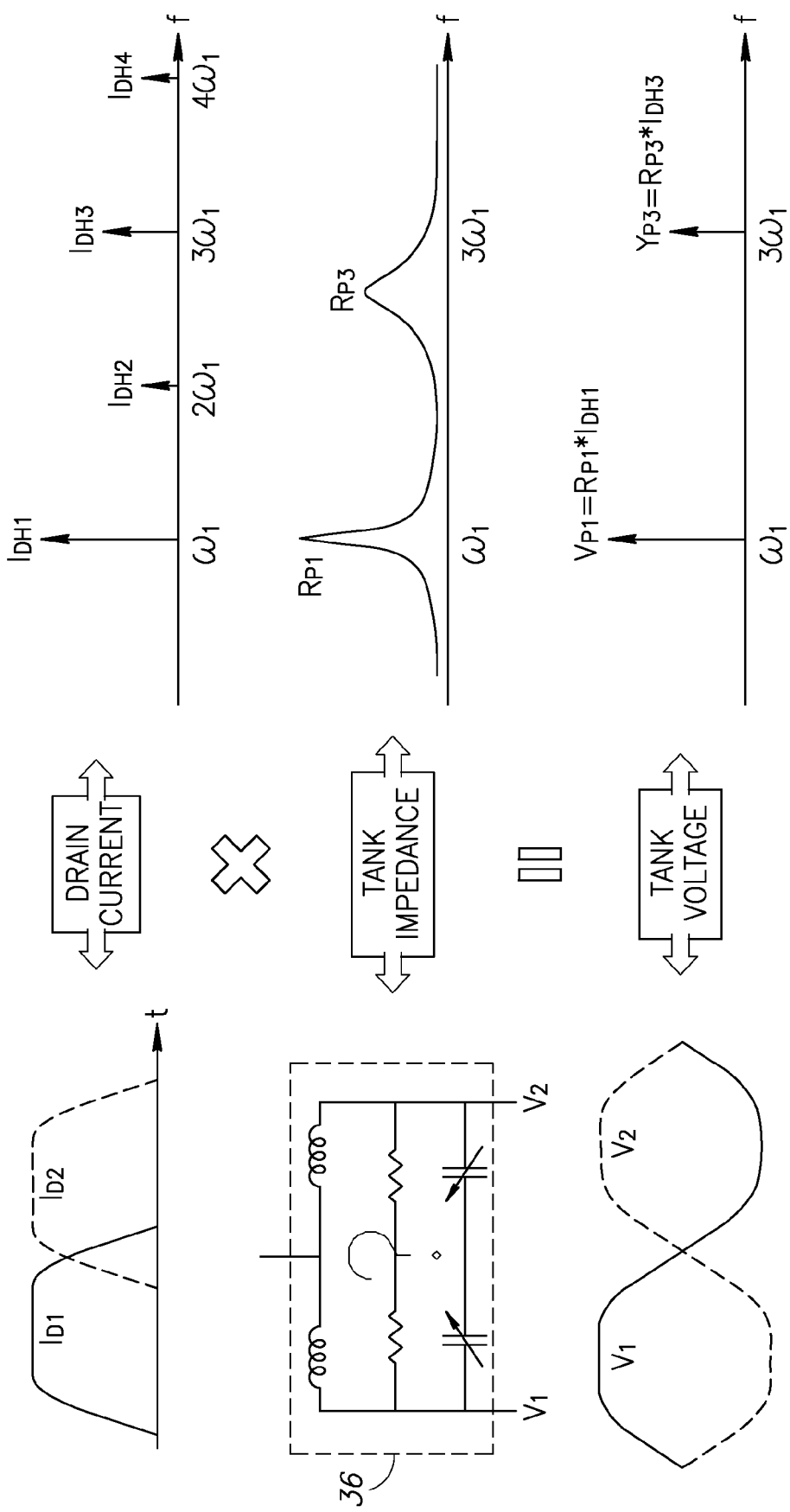
FIG. 3 is a diagram illustrating an example oscillator waveforms in the time and frequency domains for the oscillator of the present invention.
Figure 4A:
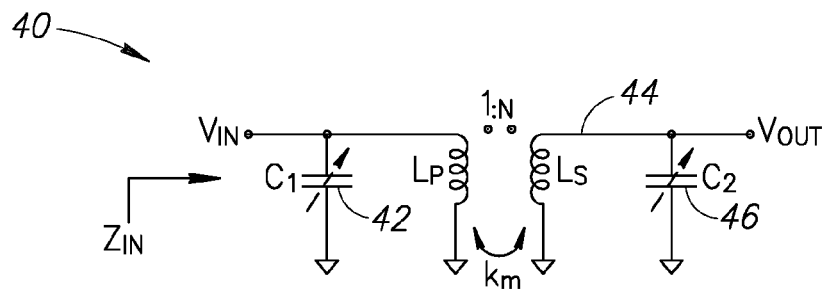
FIG. 4A is a diagram illustrating an example transformer based resonator.
Figure 4B:
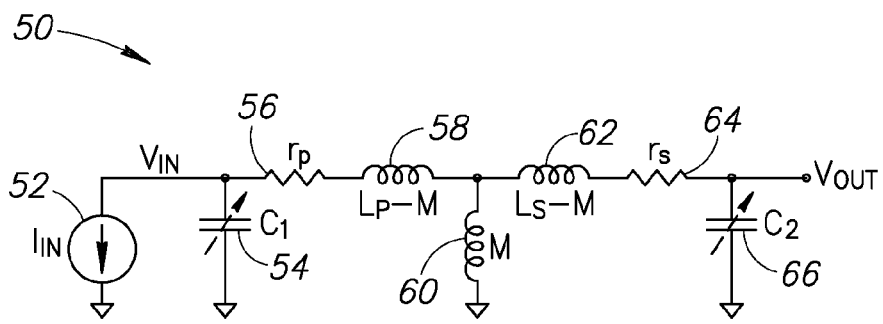
FIG. 4B is a diagram illustrating the equivalent circuit of the transformer based resonator of FIG. 4A.

The description related to FIG. 3 supra advocates the use of two resonant frequencies with a ratio of 3. One way of realizing that is with two separate inductors. This, however, is bulky and inefficient. Another way is to use a transformer-based resonator. The preferred resonator consists of a transformer with turns ratio n and tuning capacitors $C_1$ and $C_2$ at the transformer's primary and secondary windings, respectively as shown in FIGS. 4A and 4B. Equation (4) expresses the exact mathematical equation of the input impedance of the tank.

$$Z_{in} = \frac{s^3(L_p L_s C_2 (1-k_m^2)) + s^2(C_2(L_s r_p + L_p r_s)) + s(L_p + r_s r_p C_2)) + r_p}{s^4(L_p L_s C_1 C_2(1-k_m^2)) + s^3(C_1 C_2(L_s r_p + L_p r_s)) + s^2(L_p C_1 + L_s C_2 + r_p r_s C_1 C_2)) + s(r_p C_1 + r_s C_2) + 1} \quad (4)$$

where $k_m$ is the magnetic coupling factor of the transformer, $r_p$ and $r_s$ model the equivalent series resistance of the primary $L_p$ and secondary $L_s$ inductances. The denominator of $Z_{in}$ is a fourth-order polynomial for the imperfect coupling factor (i.e. $k_m<1$). Hence, the tank contains two different conjugate pole pairs, which realize two different resonant frequencies. Consequently, the input impedance has two magnitude peaks at these frequencies. Note that both resonant frequencies can satisfy the Barkhausen criterion with a sufficient loop gain. The resulting multi-oscillation behavior, however, is undesired and must be avoided. In this case, it is preferred to see an oscillation at the lower resonant frequency $\omega_1$ and the additional tank impedance at $\omega_2$ is used to make a pseudo-square waveform across the tank. These two possible resonant frequencies can be expressed as $$\omega_{1,2}^2 = \frac{1+\left(\frac{L_s C_2}{L_p C_1}\right) \pm \sqrt{1+\left(\frac{L_s C_2}{L_p C_1}\right)^2 + \left(\frac{L_s C_2}{L_p C_1}\right)(4k_m^2 - 2)}}{2L_s C_2 (1-k_m^2)} \quad (5)$$

The following expression offers a good estimation of the main resonant frequency of the tank for $0.5 < k_m < 1$.

$$\omega_1^2 = \frac{1}{(L_p C_1 + L_s C_2)} \quad (6)$$

However, we are interested in the ratio of resonant frequencies as given by $$\begin{cases} \frac{\omega_2}{\omega_1} = \sqrt{\frac{1+X+\sqrt{1+X^2+X(4k_m^2-2)}}{1+X-\sqrt{1+X^2+X(4k_m^2-2)}}} \\ X = \left(\frac{L_s}{L_p} \cdot \frac{C_2}{C_1}\right) \end{cases} \quad (7)$$

Equation 7 indicates the resonant frequency ratio $\omega_2/\omega_1$ is just a function of the transformer inductance ratio $L_s/L_p$, tuning capacitance ratio $C_2/C_1$, and transformer magnetic coupling factor $k_m$. The relative matching of capacitors (and inductors) in CMOS technology available currently is expected to be much better than 1% while the magnetic coupling is controlled through lithography that precisely sets the physical dimensions of the transformer. Consequently, the relative position of the resonant frequencies is not sensitive to the process variation.

Figure 5:
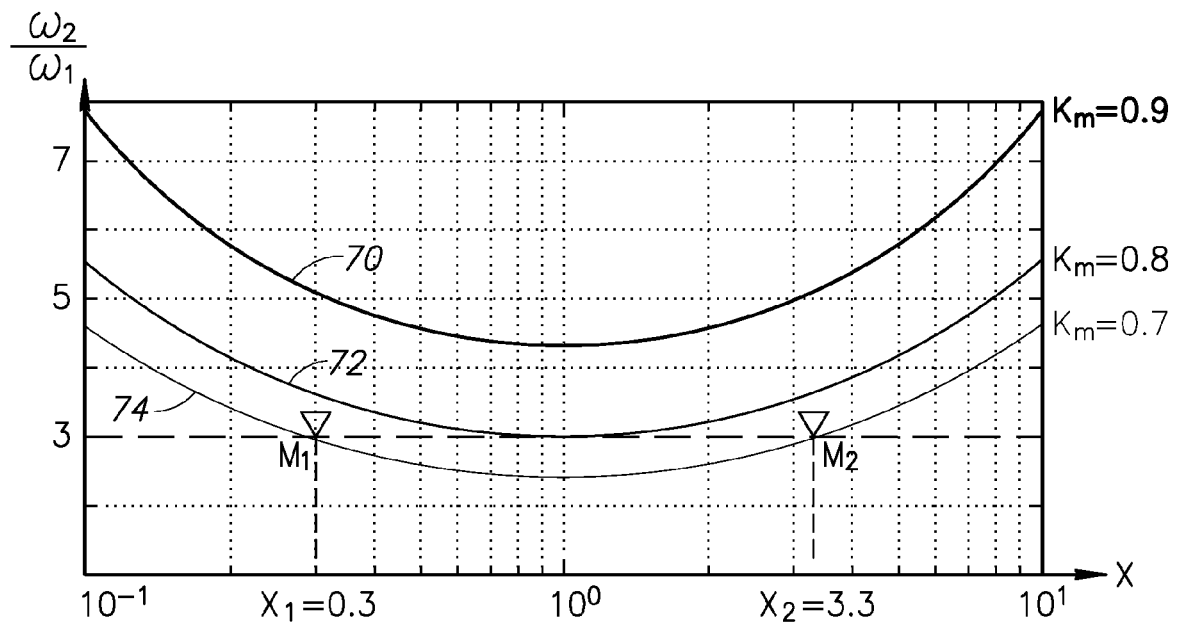
FIG. 5 is a diagram illustrating the ratio of the tank resonant frequencies versus X-factor for different $K_m$.

The $\omega_2/\omega_1$ ratio is illustrated versus X-factor for different $k_m$ in FIG. 5. As expected, the ratio moves to higher values for larger $k_m$ and finally the second resonance disappears for the perfect coupling factor. The ratio of $\omega_2/\omega_1$ reaches the desired value of 3 at two points for the coupling factor of less than 0.8. Both points put $\omega_2$ at the correct position of $3\omega_1$. The desired X-factor, however, should be chosen based on the magnitude ratio $R_{p2}/R_{p1}$ of the tank input impedance at resonance.

The sum of the even orders of the denominator in (4) is zero at resonant frequencies. It can be shown that the first-order terms of the numerator and the denominator are dominant at $\omega_1$. By using (6), assuming $Q_p = L_p \omega/r_p$, $Qs = L_s \omega/r_s$, the tank input impedance at the fundamental frequency is expressed as $$R_{p1} \approx \frac{L_p}{\omega_1 \left(\frac{L_p C_1}{Q_p} + \frac{L_s C_2}{Q_s}\right)} \xrightarrow{Q_p = Q_s = Q_0} R_{p1} \approx L_p \omega_1 Q_0 \quad (8)$$

On the other hand, it can be shown that the third-order terms of the numerator and the denominator are dominant in (4) at $\omega_2 = 3\omega_1$. It follows that $$R_{p2} \approx \frac{(1-k_m^2)}{C_1 \omega_2 \left(\frac{1}{Q_p} + \frac{1}{Q_s}\right)} \xrightarrow{Q_p = Q_s = Q_0} R_{p2} \approx \frac{Q_0(1-k_m^2)}{2C_1 \omega_2} \quad (9)$$

$R_{p2}$ is a strong function of the coupling factor of the transformer and thus the resulting leakage inductance. Weaker magnetic coupling results in higher impedance magnitude at $\omega_2$ and, consequently, the second resonance needs a lower transconductance gain to excite. It could even become a dominant pole and the circuit would oscillate at $\omega_2$ instead of $\omega_1$. This phenomenon can be used to extend the oscillator tuning range. As explained supra $R_{p2}/R_{p1}$ controls the amount of the $3^{rd}$ harmonic component of the oscillation voltage. The impedance magnitude ratio is equal to $$\frac{R_{p2}}{R_{p1}} \approx \frac{(1-k_m^2)(1+X)}{6} \quad (10)$$

Figure 6A:
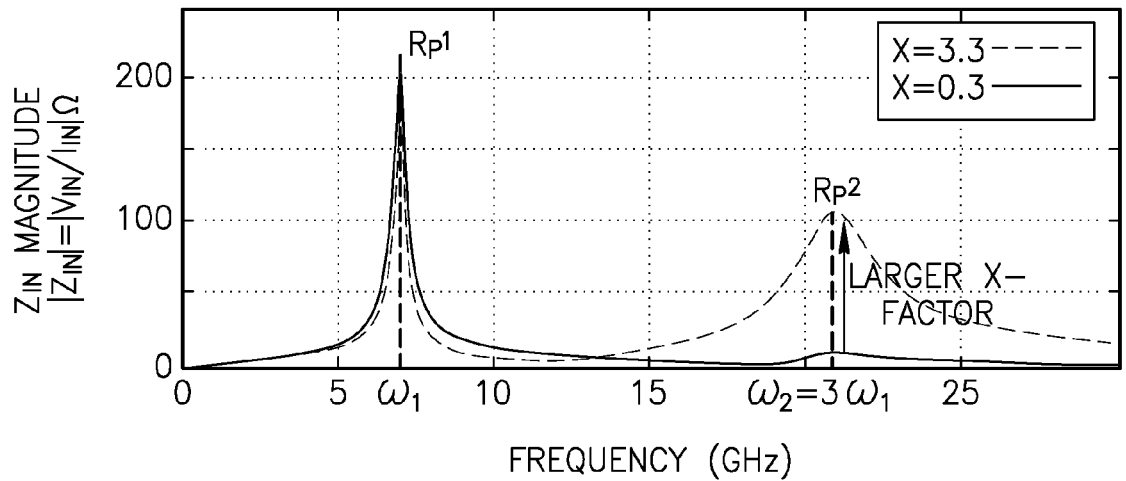
FIG. 6A is a diagram illustrating the magnitude of the input impedance $Z_{in}$ of the transformer based tank for two different X-factor which satisfy the resonant frequency ratio of 3.

Hence, the smaller X-factor results in lower tank equivalent resistance at $\omega_2 = 3\omega_1$. Thus, the tank filters out more of the $3^{rd}$ harmonic of the drain current and the oscillation voltage becomes more sinusoidal. FIG. 6A illustrates simulation results of $Z_{in}$ of the transformer-based tank versus frequency for both X-factors that satisfy the resonant frequency ratio of 3. The larger X-factor offers significantly higher tank impedance at $\omega_2$, which is in agreement with the theoretical analysis.

Figure 6B:
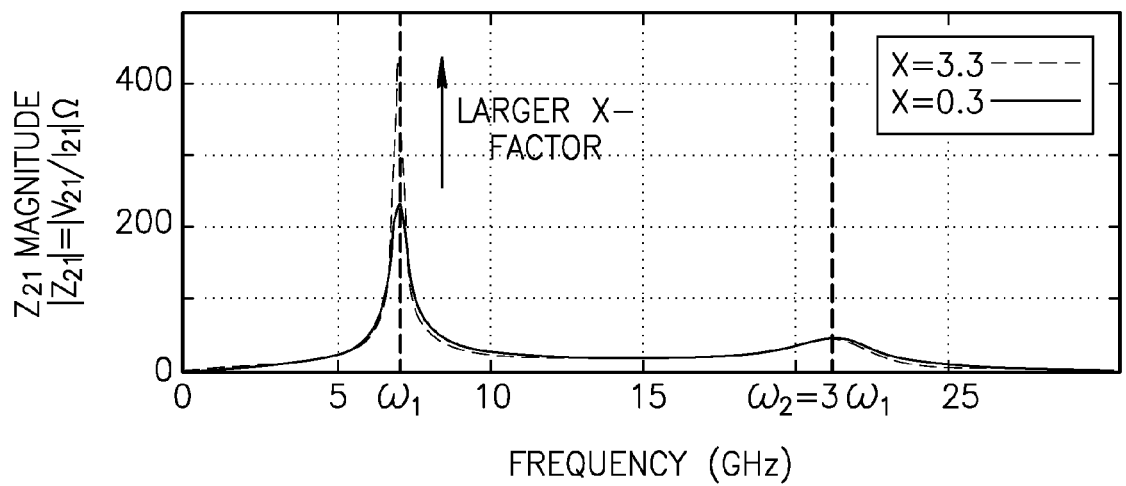
FIG. 6B is a diagram illustrating the magnitude of the trans-impedance $Z_{21}$ of the transformer based tank for two different X-factor which satisfy the resonant frequency ratio of 3
Figure 6C:
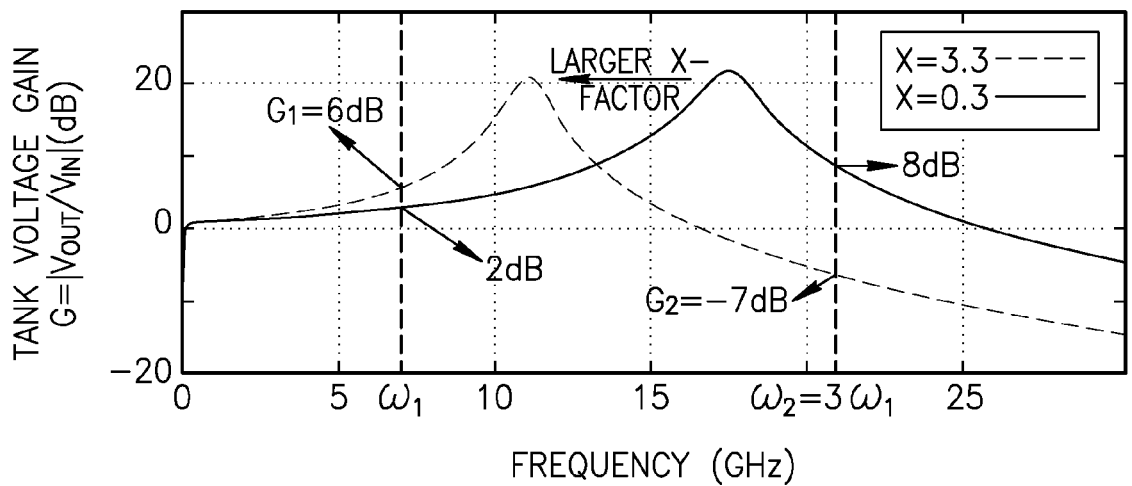
FIG. 6C is a diagram illustrating the transformer's secondary to primary voltage gain of the transformer based tank for two different X-factor which satisfy the resonant frequency ratio of 3.
Figure 6D:
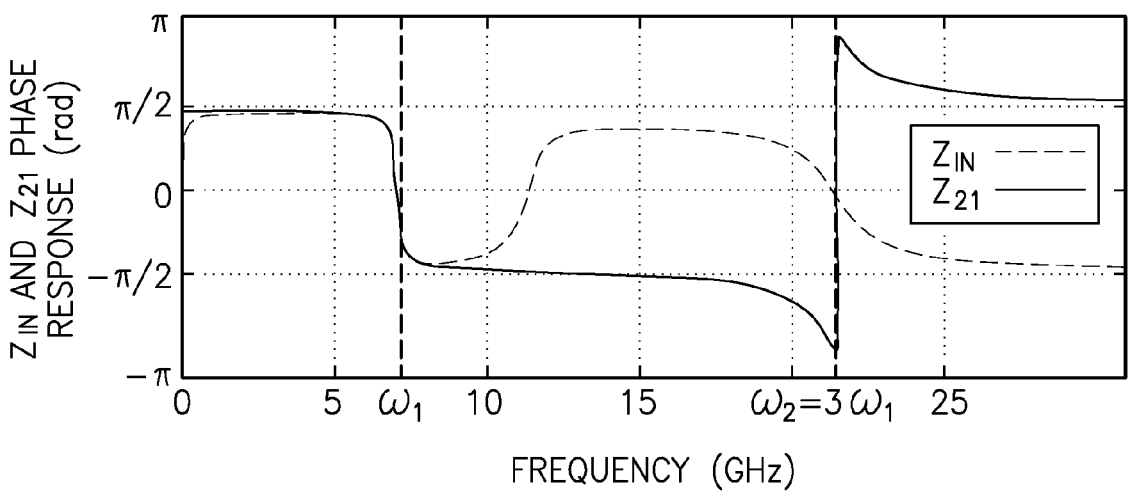
FIG. 6D is a diagram illustrating the phase of the input impedance $Z_{in}$ and trans-impedance $Z_{21}$ of the transformer based tank.

A diagram illustrating the magnitude of the trans-impedance $Z_{21}$ of the transformer based tank is shown in FIG. 6B. A diagram illustrating the transformer's secondary to primary voltage gain of the transformer based tank is shown in FIG. 6C. A diagram illustrating the phase of magnitude of the input impedance $Z_{in}$ and trans-impedance $Z_{21}$ of the transformer based tank is shown in FIG. 6D.

The X-factor is defined as a product of the transformer inductance ratio $L_s/L_p$ and tuning capacitance ratio $C_2/C_1$. This leads to a question of how best to divide X-factor between the inductance and capacitance ratios. In general, larger $L_s/L_p$ results in higher inter-winding voltage gain, which translates to sharper transition at zero-crossings and larger oscillation amplitude at the secondary winding. Both of these effects have a direct consequence on the phase noise improvement. The transformer Q-factor, however, drops by increasing the turns ratio. In addition, very large oscillation voltage swing brings up reliability issues due to the gate-oxide breakdown. It turns out that the turns ratio of 2 can satisfy the aforementioned constraints.

The transformer-based resonator, whose schematic is shown in FIG. 4A and equivalent circuit in FIG. 4B, offers a filtering function on the signal path from the primary to the secondary windings. The tank voltage gain is derived as $$G(s) = \frac{V_{out}}{V_{in}} \qquad (11)$$
$$= \frac{Ms}{s^3(L_p L_s C_2 (1-k_m^2)) + s^2(C_2(L_s r_p + L_p r_s)) + s(L_p + r_s r_p C_2)) + r_p}$$

Figure 7:
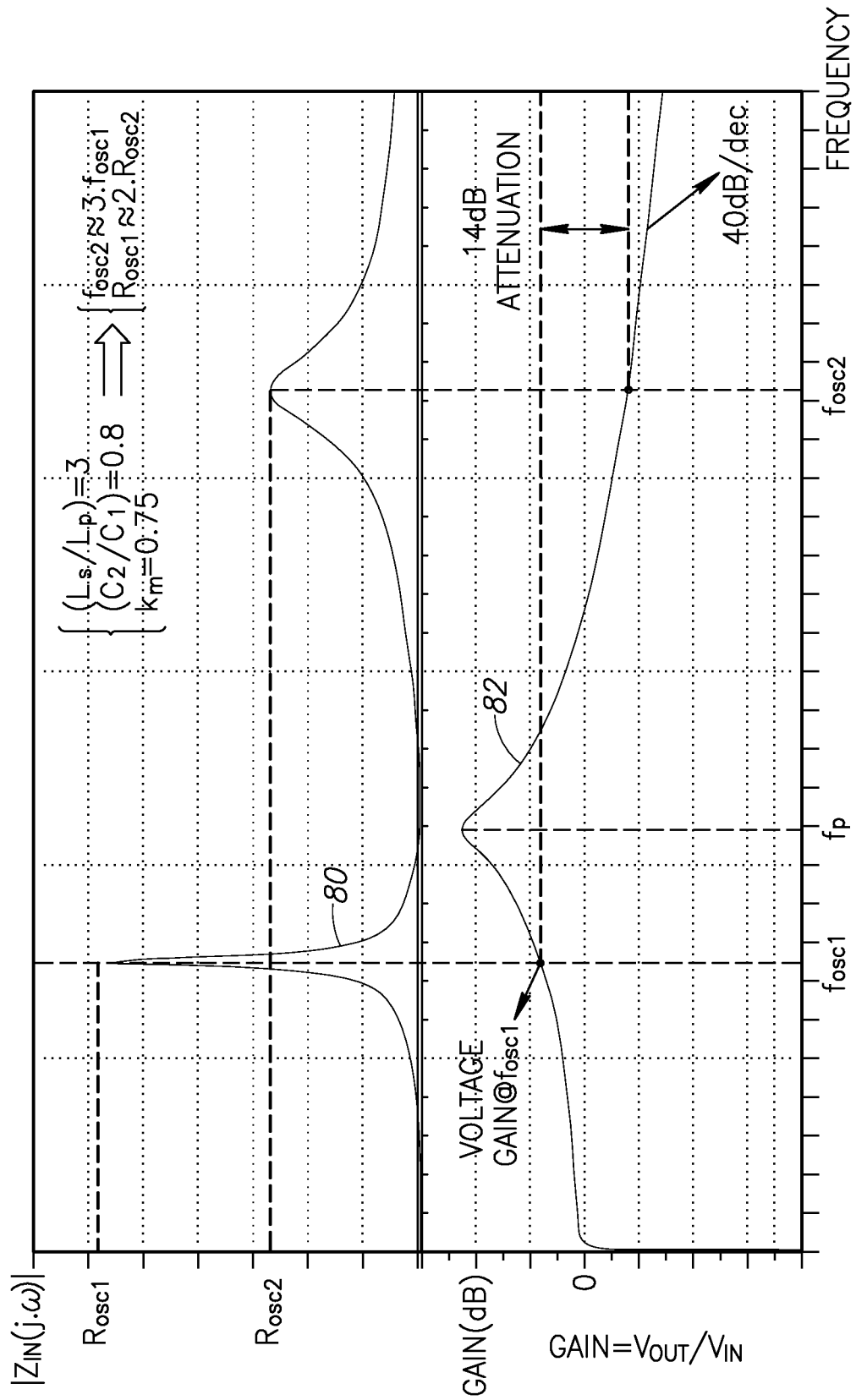
FIG. 7 is a diagram illustrating the oscillator tank input impedance and voltage gain.

As shown in FIG. 7, the tank exhibits a 20 dB/dec attenuation for frequencies lower than the first pole and offers a constant voltage gain at frequencies between the first pole and the complex conjugate pole pair at $\omega_p$. The gain plot reveals an interesting peak at frequencies around $\omega_p$, beyond which the filter gain drops at the −40 dB/dec slope. The low frequency pole is estimated by $$\omega_{p1} = \frac{r_p}{L_p} \qquad (12)$$

By substituting $r_p = L_p \omega/Q_p$, $r_s = L_s \omega/Q_s$ and assuming $Q_p \cdot Q_s \gg 1$, the tank gain transfer function can be simplified to the following equation for the frequencies beyond $\omega_p$.

$$\begin{cases} G(s) = \dfrac{\dfrac{M}{L_p}}{s^2(L_s C_2(1-k_m^2)) + s\left(L_s C_2 \omega\left(\dfrac{1}{Q_p} + \dfrac{1}{Q_s}\right)\right) + 1} \\ G(s) = \dfrac{G_0}{\left(\dfrac{s}{\omega_p}\right)^2 + \left(\dfrac{s}{\omega_p Q_f}\right) + 1} \end{cases} \qquad (13)$$

The main characteristics of the tank voltage gain can be specified by considering it as a biquad filter.

$$G_0 = k_m \eta \qquad (14)$$

The peak frequency is estimated by $$\omega_p = \sqrt{\frac{1}{L_s C_2(1-k_m^2)}} \qquad (15)$$

$Q_f$ represents the amount of gain jump around $\omega_p$ and expressed by $$Q_f = \frac{(1-k_m^2)}{\dfrac{1}{Q_p} + \dfrac{1}{Q_s}} \qquad (16)$$

Hence, the maximum voltage gain is calculated by $$G_{max} = k_m n \times \frac{(1-k_m^2)}{\dfrac{1}{Q_p} + \dfrac{1}{Q_s}} \qquad (17)$$

Equations (17) and FIG. 7 demonstrate that the transformer-based resonator can have a voltage gain above $k_m n$ at the frequencies near $\omega_p$ for $k_m < 1$ and the peak magnitude is increased by improving Q-factor of the transformer individual inductors. Consequently, $\omega_1$ should be close to $\omega_p$ to have higher passive gain at the fundamental frequency and more attenuation at its harmonic components. Equations (6) and (15) indicate that $\omega_p$ is always located at frequencies above $\omega_1$ and the frequency gap between them decreases with greater X-factor. FIG. 6C illustrates the voltage gain of the transformer-based tank for two different X-factors that exhibit the same resonant frequencies. The transformer peak gain happens at much higher frequencies for the smaller X-factor and, therefore, the gain is limited to only $k_m n$ (2 dB in this case) at $\omega_1$. X-factor is around 3 for the proposed oscillator and, as a consequence, $\omega_p$ moves lower and much closer to $\omega_1$. Now the tank offers higher voltage gain (G1=6 dB in this case) at the main resonance and more attenuation (G2=−7 dB) at $\omega_2$. This translates to larger oscillation voltage swing and thus better phase noise.

As can be seen in FIG. 6D the input impedance $Z_{in}$ phase is zero at the first and second resonant frequencies. Hence, any injected 3$^{rd}$ harmonic current has a constructive effect resulting in sharper zero-crossings and flat peak for the transformer's primary winding voltage. The tank trans-impedance $Z_{21}$ phase, however, shows a 180 degree phase difference at $\omega_1$ and $\omega_2 = 3\omega_1$. Consequently, the 3$^{rd}$ harmonic current injection at the primary windings leads to a slower zero-crossings slope at the transformer's secondary, which has an adverse outcome on the phase noise performance of the oscillator. FIGS. 6A, 6B, 6C illustrate that the proposed transformer-based resonator effectively filters out the 3$^{rd}$ harmonic component of the drain current at the secondary winding in order to minimize these side effects and zero-crossings are sharpened by tank's voltage gain (G1) at $\omega_1$. Table 1 shows that the zero-crossings slope of the proposed oscillator at both transformer's windings are improved compared to the traditional oscillator for the same $V_{DD}$, which is translated to shorter commutating time and lower active device noise factor.

TABLE 1

Normalized Zero-Crossing Slope of the Oscillator

| | Normalized zero-crossing slope |
|---|---|
| Traditional LC | 1 |
| Proposed tank (primary) | $1 + 3\zeta = 1 + 3 \cdot 1/6 = 1.5$ |
| Proposed tank (secondary) | $G_1 - 3G_2\zeta = 2.1 - 3 \cdot 0.4 \cdot 1/6 = 1.9$ |

Figure 8B:
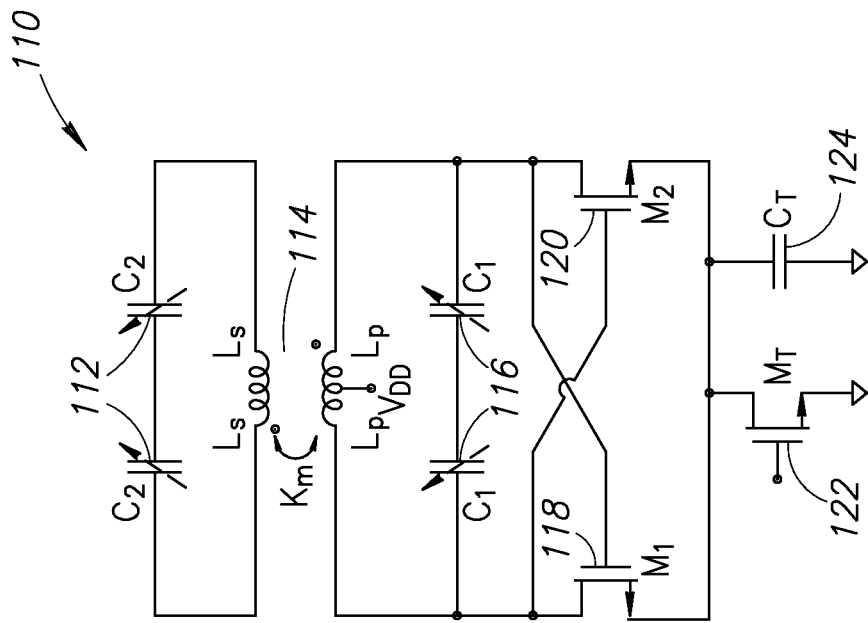
FIG. 8B is a diagram illustrating a cross-coupled second example transformer based class-F oscillator.
Figure 8A:
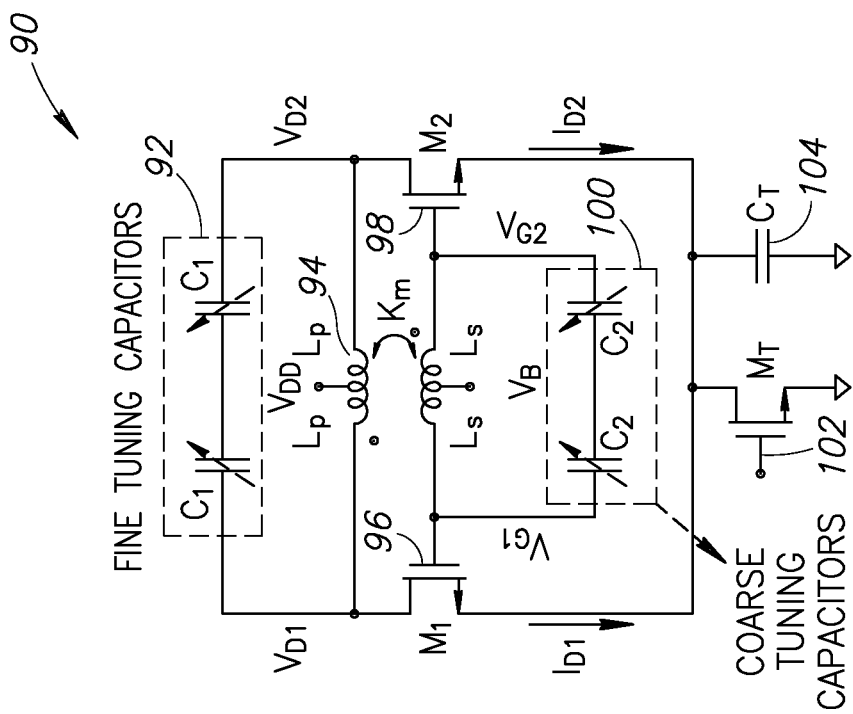
FIG. 8A is a diagram illustrating a transformer-coupled first example transformer based class-F oscillator.

The desired tank impedance, inductance and capacitance ratios for the oscillator of the present invention were determined above to enforce the pseudo-square wave oscillation voltage around the tank. Two transistors are added to the transformer based resonator to sustain the oscillation. There are two options, however, as shown in FIGS. 8A and 8B for connecting the transformer to the active gm-devices. FIG. 8A illustrates a first option which is a transformer-coupled class-F oscillator in which the secondary winding is connected to the gate of the gm-devices. FIG. 8B illustrates the second option which is a cross-coupled class-F oscillator with a floating secondary transformer winding which only physically connects to tuning capacitors $C_2$. The oscillation voltage swing, the equivalent resonator quality factor and tank input impedance are the same for both options. The gm-device, however, sustains larger voltage swings in the first option. Consequently, its commutation time is shorter and the active device noise factor is lower. In addition, the gm-device generates higher amount of the $3^{rd}$ harmonic, which results in sharper pseudo-square oscillation voltage with lower ISF rms value.

Figure 10A:
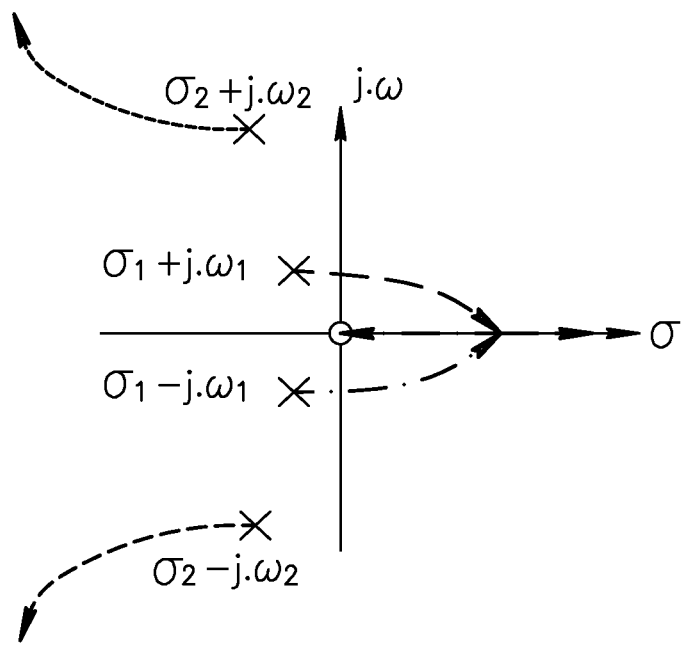
FIG. 10A is a diagram illustrating the root locus plot of the transformer coupled class-F oscillator of FIG. 8A.
Figure 10B:
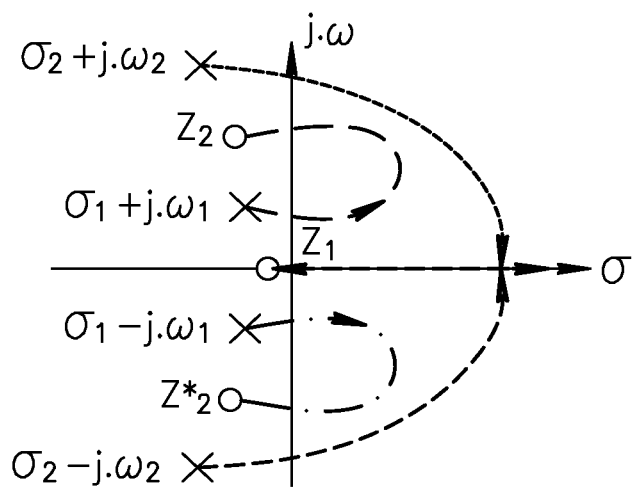
FIG. 10B is a diagram illustrating the root locus plot of the cross coupled transformer based class-F oscillator of FIG. 8B.

Another difference concerns the possibility of oscillation at $\omega_2$ instead of $\omega_1$. The root-locus plots in FIGS. 10A and 10B illustrate the route of pole movements towards zeros for different values of the oscillator loop trans-conductance gain (Gm). As can be seen in FIG. 10B both resonant frequencies ($\omega_1$, $\omega_2$) can be excited simultaneously with a relatively high value of Gm for the cross-coupled class-F oscillator of FIG. 8B. It can increase the likelihood of the undesired oscillation at $\omega_2$. The transformer-coupled circuit of FIG. 8A, however, demonstrates different behavior. As shown in FIG. 10A, the lower frequency conjugate pole pair moves into the right-hand plane by increasing the absolute value of Gm, while the higher poles are pushed far away from imaginary axis. This guarantees the oscillation can only happen at $\omega_1$. Consequently, it is clear that the transformer-coupled oscillator (i.e. FIG. 8A) is preferred due to its phase noise performance and the guaranty of operation at the right resonant frequency. Nevertheless, the gate parasitic capacitance appears at the drain through a scaling factor of $n^2$, which reduces its tuning range somewhat as compared to the cross-coupled candidate.

Figure 9A:
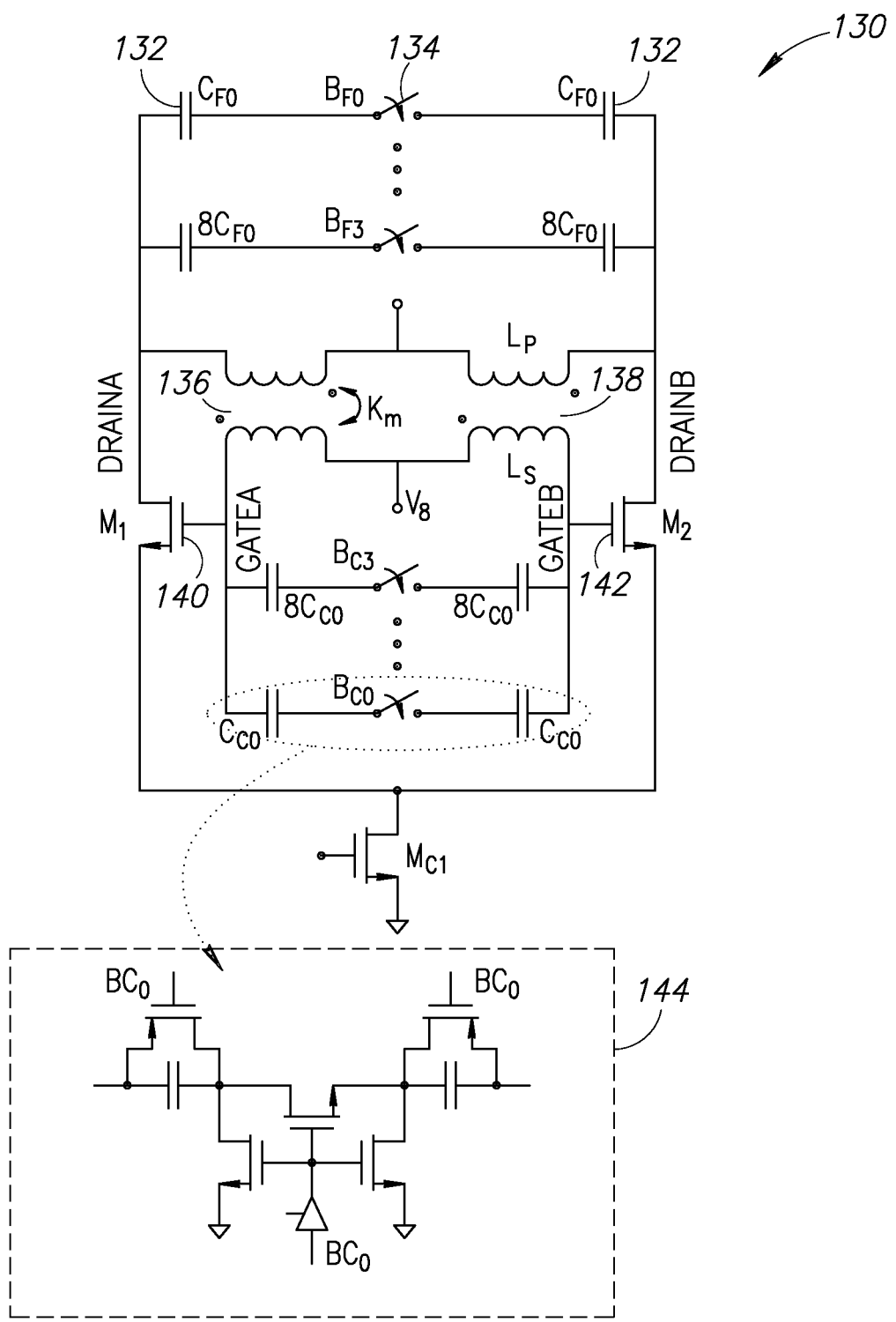
FIG. 9A is a schematic diagram illustrating an example oscillator and digital switch capacitor circuit.
Figure 9B:
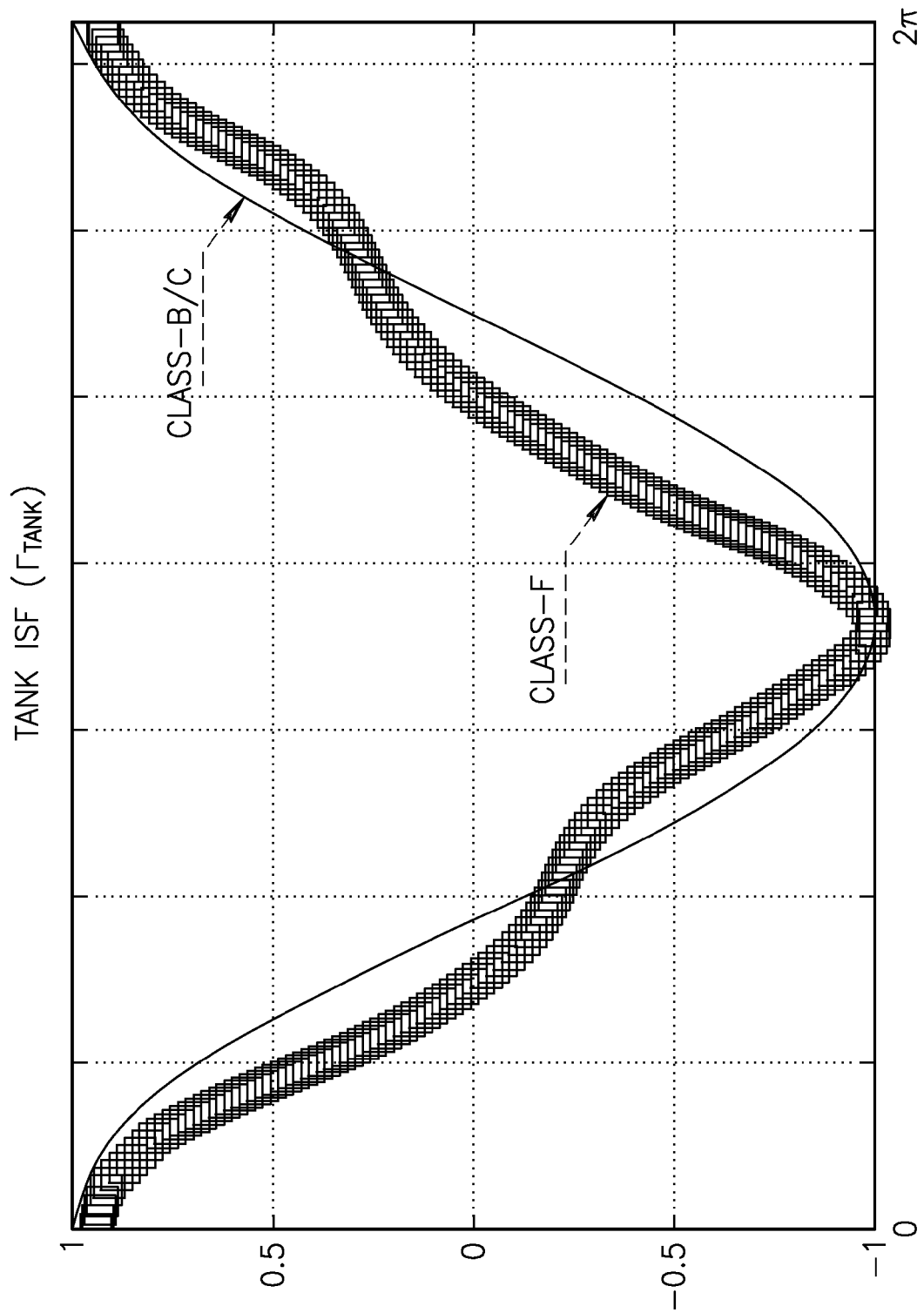
FIG. 9B is a diagram illustrating oscillator transient signal and impulse sensitivity function across the tank.

A schematic diagram illustrating an example oscillator and digital switch capacitor circuit is shown in FIG. 9A. A diagram illustrating oscillator transient signal and impulse sensitivity function across the tank is shown in FIG. 9B.

Figure 11:
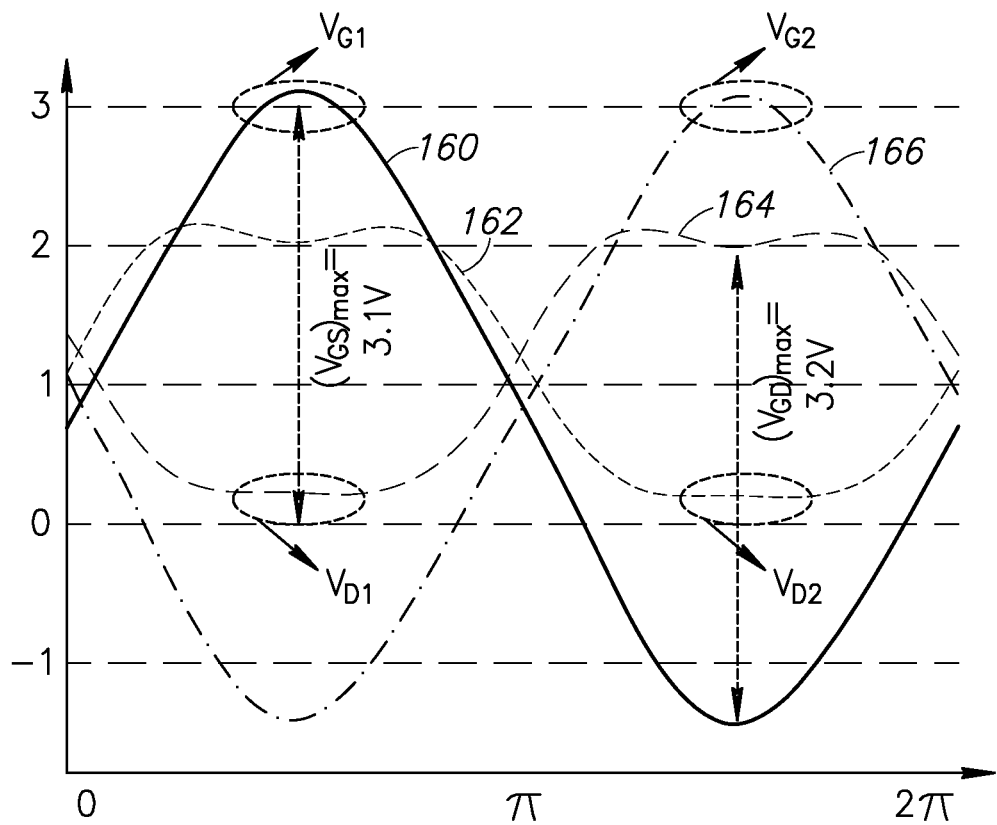
FIG. 11 is a graph illustrating the oscillation voltage waveforms of the class-F oscillator.

FIG. 11 illustrates the oscillation voltage waveforms of the proposed transformer-coupled class-F oscillator. As discussed supra, the $3^{rd}$ harmonic component of the drain voltage attenuates at the gate and thus a sinusoidal wave is seen there. The gate-drain voltage swing goes as high as $2.7 \cdot V_{DD}$ due to the significant voltage gain of the tank. Hence, using thick oxide gm-devices is a constraint to satisfy the time-dependent dielectric breakdown (TDDB) issue for less than 0.01% failure rate during ten years of the oscillator operation. The costs are larger parasitics capacitance and slightly lower frequency tuning range.

The frequency tuning requires a bit different consideration in the class-F oscillator. Both $C_1$ and $C_2$ must, at a coarse level, be changed simultaneously to maintain $L_sC_2/L_pC_1$ ratio such that $\omega_2$ aligns with $3\omega_1$.

Figure 12:
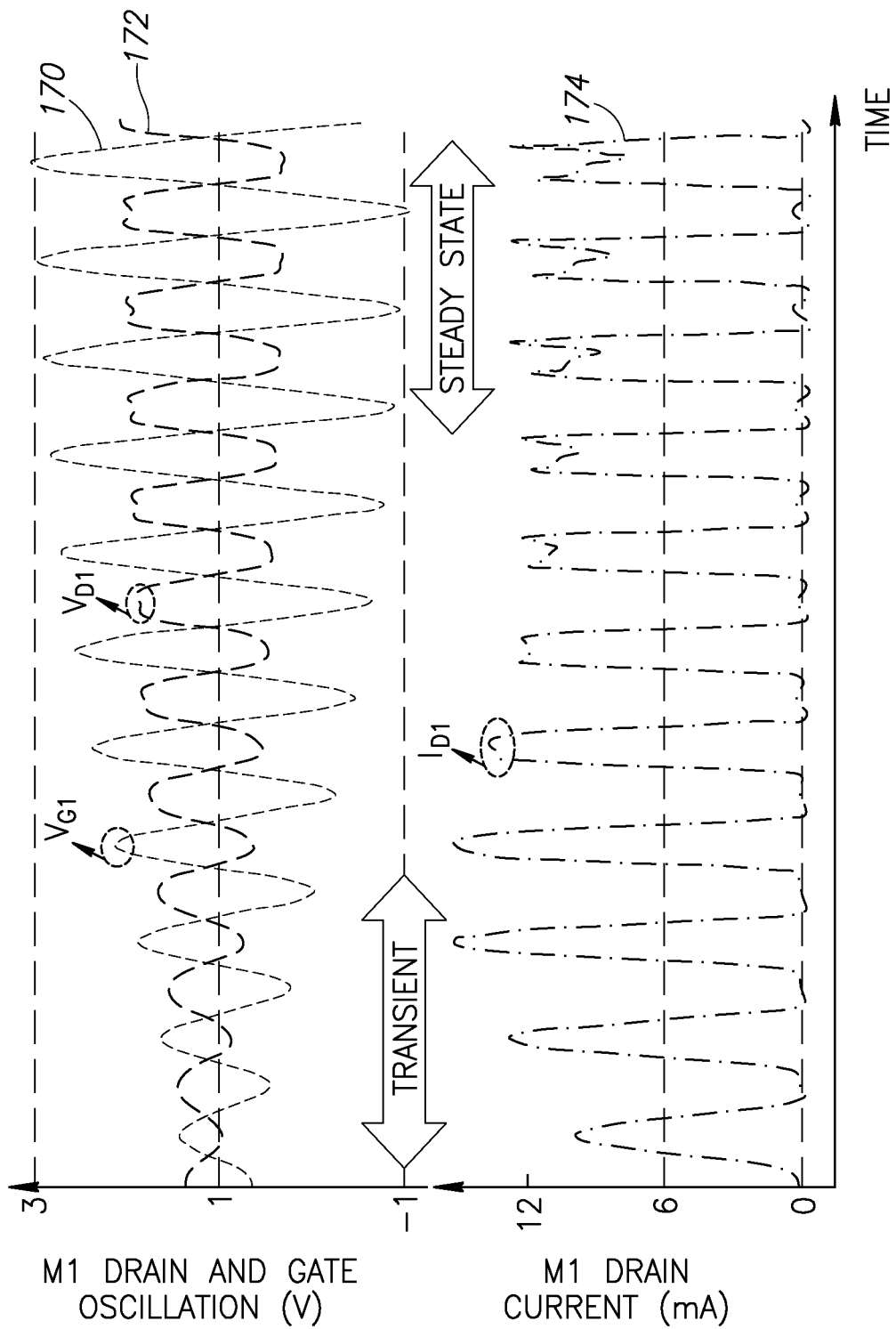
FIG. 12 is a graph illustrating the transient response of the class-F oscillator.

FIG. 12 shows the transient response of the class-F oscillator. At power up, the oscillation voltage is very small and the drain current pulses have narrow and tall shape. Even though the tank has an additional impedance at $3\omega_1$, the $3^{rd}$ harmonic component of the drain current is negligible and, consequently, the drain oscillation resembles a sinusoid. At steady state, gate oscillation voltage swing is large and the gm-device drain current is square-wave. Consequently, the combination of the tank input impedance with significant drain's $3^{rd}$ harmonic component results in the pseudo-square wave for the drain oscillation voltage. This justifies its "class-F" designation.

The Q-factor of the complex tank, which comprises two coupled resonators, is not straightforward in intuitive understanding as the Q-factor of the individual physical inductors. It is, therefore, helpful to understand the relationship between the open-loop Q-factor of the tank versus the Q-factor of the inductive and capacitive parts of the resonator. First, consider the tuning capacitance losses to be negligible. Consequently, the oscillator equivalent Q-factor includes only the tank's inductive part losses. The open-loop Q-factor of the oscillator is defined as $w_0/2 \cdot d\phi/d\omega$, where $\omega_0$ is the resonant frequency and $d\phi/d\omega$ denotes the slope of the phase of the oscillator open-loop transfer function. To determine the open-loop Q we need to break the oscillator loop at the gate of $M_1$. The open-loop transfer function is thus given by $$H(s) = \frac{V_{out}}{I_{in}} \qquad (18)$$

$$= \frac{Ms}{As^4 + Bs^3 + Cs^2 + Ds + 1}$$

where,
$A=(L_pL_sC_1C_2(1-k_m^2))$, $B=C_1C_2(L_sr_p+L_pr_s)$, $C=(L_pC_1+L_sC_2+r_pr_sC_1C_2)$, and, $D=(r_pC_1+r_sC_2)$. After carrying out lengthy algebra and considering $(1-C\omega^2+A\omega^4 \approx 0)$ at the resonant frequencies, $$Q_i = -\frac{\omega}{2}\frac{d\phi(\omega)}{d\omega} \qquad (19)$$

$$= \frac{(C\omega - 2A\omega^3)}{(D - B\omega^2)}$$

Substituting A, B, C and D into (19), then swapping $r_p$ and $r_s$ with $L_p\omega/Q_p$ and $L_s\omega/Q_s$, respectively, and assuming $Q_pQ_s \gg 1$, we obtain $$Q_i = -\frac{(L_pC_1 + L_sC_2) - 2(L_pL_sC_1C_2(1-k_m^2))\omega^2}{\left(\frac{L_pC_1}{Q_p} + \frac{L_sC_2}{Q_s}\right) - \left(C_1C_2L_sL_p\left(\frac{1}{Q_p} + \frac{1}{Q_s}\right)\right)\omega^2} \qquad (20)$$

After substituting (5) as $\omega$ into the above equation, the tank's inductive part Q-factor at $\omega_1$ is obtained by $$Q_i = \frac{(1 + X^2 + 2k_m X)}{\left(\frac{1}{Q_p} + \frac{X^2}{Q_s}\right)} \quad (21)$$

To help with an intuitive understanding, consider a boundary case. Suppose, that $C_2$ is negligible. Therefore, X-factor is zero and (21) predicts that the $Q_i$ equals to $Q_p$. This is not surprising, because no energy would be stored at the transformer's secondary winding and its Q-factor would not have any contribution to the equivalent Q-factor of the tank. In addition, (21) predicts that the equivalent Q-factor of the tank's inductive part can exceed Q-factors of the individual inductors. To the authors' best knowledge, this is the first ever report of quantifying the equivalent Q-factor of the transformer-based resonator at its both resonant frequencies in a general case that clearly proves Q-factor enhancement over that of the transformer individual inductors. The maximum tank's inductive part Q-factor is obtained at the following X-factor for a given $k_m$, $Q_p$ and $Q_s$.

$$X_{Q_{max}} = \frac{Q_s}{Q_p} \quad (22)$$

For a typical case of $Q_s = Q_p = Q_0$, the maximum $Q_i$ at $\omega_1$ is calculated by $$\begin{cases} X_{Qi,max} = 1 \\ Q_{i,max} = Q_0(1 + k_m) \end{cases} \quad (23)$$

The above equation indicates that the equivalent Q-factor of the inductive part of the transformer-based resonator can be enhanced by a factor of $1+k_m$ at the optimum state. It does not necessarily mean, however, that the Q-factor of the transformer-based tank generally is superior to the simple LC resonator. The reason is that it is not possible to optimize the Q-factor of both windings of a 1:n transformer at a given frequency and one needs to use lower metal layers for the transformer cross connections, which results in more losses and lower Q-factor. In the examples provided herein, the X-factor is approximately 3 with $k_m$=0.7 and the simulated $Q_p$ and $Q_s$ are 14 and 20 respectively. Based on (21), the equivalent Q-factor of the inductive part of the tank would be about 26, which is higher than that of the transformers' individual inductors.

The Q-factor of the switched capacitance largely depends on the tuning range (TR) and operating frequency of the oscillator and is about 42 for the TR of 25% at 7 GHz resulting in an average Q-factor of 16 for the tank in this design.

According to the well-known linear time-variant model, the phase noise of the oscillator at an offset frequency $\Delta\omega$ from its fundamental frequency is expressed as, $$L(\Delta\omega) = 10\log_{10}\left(\frac{\sum_i N_{L,i}}{2q_{max}^2(\Delta\omega)^2}\right) \quad (24)$$

where, $q_{max}$ is the maximum charge displacement across the tuning capacitor C, and $N_L \cdot i$ is the effective noise produced by $i^{th}$ device given by $$N_{L,i} = \frac{1}{2\pi N^2}\int_0^{2\pi} \Gamma_i^2(t)\overline{i_{n,i}^2(t)}\,dt \quad (25)$$

where $\overline{i_{n,i}^2(t)}$ is the white current noise power density of the $i^{th}$ noise source, $\Gamma_i$ is its relevant ISF function from the corresponding $i^{th}$ device noise, and N is the number of resonators in the oscillator. N is considered one for single-ended and two for differential oscillator topologies with a single LC tank.

TABLE 2

Comparison of Different Oscillator Classes for the same $V_{DD}$ (1.2 V), Tank Q-Factor (15), $R_p$ (220 Ohm) and Carrier Frequency (7 GHa) at 3 MHz Offset Frequency

|  | Theoretical expression | Class-B | Dynamic biased Class-C | Class-F |
|---|---|---|---|---|
| $F_{RP}$ | $2\Gamma_{rms}^2 = \frac{1 + 9\zeta^2}{(1 + 3\zeta)^2}$ | 1 (average) | 1 (average) | 0.7 (best) |
| $F_{GDS}$ | $2\Gamma_{rms}^2 R_P G_{DSEF1}$ | 0.56 (worst) | 0.07 (best) | 0.27 (average) |
| $F_{GM}$ | $2\Gamma_{rms}^2 \frac{\gamma}{A}(1 + R_P G_{DS1EF})$ | 1.56γ = 2.02 (worst) | 1.07γ = 1.39 (average) | 0.7γ = 0.91 (best) |
| F (dB) | $10\log_{10}\left(2\Gamma_{rms}^2(1 + \frac{\gamma}{A})(1 + R_P G_{DS1EF})\right)$ | 5.5 (worst) | 3.9 (average) | 2.8 (best) |
| $\alpha_I$ | $I_{H1}/I_B$ | 0.55 (worst) | 0.9 (best) | 0.6 (average) |
| $\alpha_V$ | $V_p/V_{DD}$ | 0.8 (best) | 0.7 (average) | 0.8 (best) |
| PN (dBc/Hz) | $10\log_{10}\left(\frac{K_B T R_p}{2Q_0^2 V_p^2}\cdot F \cdot \left(\frac{\omega_0}{\Delta\omega}\right)^2\right)$ | −133.5 (worst) | −134 (average) | −136 (best) |
| FoM (dB) | $-10\log_{10}\left(\frac{10^3 K_B T}{2Q_0^2 \alpha_I \alpha_V}2\Gamma_{rms}^2(1 + \frac{\gamma}{A})(1 + R_P G_{DS1EF})\right)$ | 191.2 (worst) | 194.5 (best) | 194.2 (average) |

Table 2 above summarizes the performance of different oscillator classes of this example. It can be concluded that class-F oscillator achieves the lowest circuit-to-phase noise conversion along the best phase noise performance with almost the same power efficiency as the class-C oscillator.

The use of transformer in the Class-F configuration offers an additional reduction of the $1/f^3$ phase noise corner. The transformer inherently rejects the common-mode signals. Hence, the 1/f noise of the tail current source can appear at the transformer's primary but it will be effectively filtered out on the path to the secondary winding. Consequently, the AM-to-PM conversion at the C2 switched capacitors is entirely avoided.

Another 1/f phase noise conversion mechanism is known as the Groszkowski effect in which the presence of harmonic components of the active device current in the tank can cause a frequency drift from the tank resonance. The harmonic components of the drain current mainly take the capacitance path due its lower impedance. As a consequence, the oscillation frequency must shift down to satisfy the resonance condition. Consequently, any variation in harmonic-to-fundamental drain current value due to the 1/f noise of tail current transistor can modulate Groszkowski's frequency shift and show itself as a low frequency noise in the phase noise sidebands. The class-F tank of the present invention has two impedance peaks at the fundamental oscillation frequency and its $3^{rd}$ harmonic. Hence, the $3^{rd}$ harmonic component (i.e. the strongest among the higher harmonics) of drain current flows to the resistive part of the tank and does not contribute to Groszkowski's frequency shift. It effectively reduces the 1/f noise upconversion to the $1/f^3$ phase noise due to Groszkowski phenomenon.

FIG. 6A illustrates the tank input impedance magnitude and phase for the imperfect position of the second resonance frequency $\omega_2$. A 6% mismatch is applied to the $C_2/C_1$ ratio, which shifts $\omega_2$ to frequencies higher than $3\omega_1$. Hence, the $3^{rd}$ harmonic of the drain current is multiplied by a lower impedance magnitude with a phase shift resulting in a distorted pseudo-square oscillation waveform as shown in FIG. 6D. Intuitively, if the Q-factor at $\omega_2$ was smaller, the tank impedance bandwidth around it would be wider. Therefore, the tank input impedance phase shift and magnitude reduction would be less for a given $\omega_2$ drift from $3\omega_1$. As a consequence, the oscillator would be less sensitive to the position of $\omega_2$ and thus the tuning capacitance ratio. Based on the open-loop Q-factor analysis, substituting $\omega^2/(L_sC_2+L_pC^1)$ into (20), the $Q_i$ is obtained as $0.3Q_0$ at $\omega_2$. The tank configuration of the present invention automatically reduces the equivalent tank Q-factor at $\omega_2$ to 30% of the main resonance Q-factor. This is completely in line with the desire to reduce the sensitivity to the position of $\omega_2$ in class-F. Consequently, a realistic example±30 fF variation in $C_1$ from its optimum point has absolutely no major side effects on the oscillator waveform and thus its phase noise performance, as apparent from FIGS. 6A and 6D. It is strongly emphasized that the circuit oscillates based on $\omega_1$ resonance and low Q-factor at $\omega_2$ has no adverse consequence on the oscillator phase noise performance.

The class-F oscillator, whose schematic was described supra in connection with FIG. 8A, has been realized in TSMC 1P7M 65-nm CMOS technology with Alucap layer. The differential transistors are thick-oxide devices of 12(4-μm/0.28-μm) dimension to withstand large gate voltage swing. The tail current source $M_T$ is implemented, however, as a thin-oxide 500-μm/0.24-μm device biased in saturation. The large channel length is selected to minimize its 1/f noise. Its large drain-bulk and drain-gate parasitic capacitances combined with $C_T$=2 pF MOM capacitor shunt the $M_T$ thermal noise to ground. The step-up 1:2 transformer is realized by stacking the 1.45 μm Alucap layer on top of the 3.4 μm thick top (M7 layer) copper metal. Its primary and secondary differential self-inductances are approximately 500 pH and 1500 pH, respectively, with the magnetic coupling factor of 0.73.

The transformer was designed with a goal of maximizing Q-factor of the secondary winding, $Q_s$, at the desired operating frequency. Based on (21), $Q_s$ is the dominant factor in the tank equivalent Q-factor expression, provided $(L_sC_2)/(L_pC_1)$ is larger than one, which is valid for this oscillator prototype. In addition, the oscillation voltage is sinusoidal across the secondary winding. It means the oscillator phase noise is more sensitive to the circuit noise at the secondary winding compared to the primary side with the pseudo-square waveform. Four switched MOM capacitors BC0-BC3 placed across the secondary winding realize coarse tuning bits, while the fine control bits BF0-BF3 with LSB size of 20 fF adjust the position of $\omega_2$ near $3\omega_1$. The center tap of the secondary winding is connected to the bias voltage, which is fixed around 1 V to guarantee safe oscillator start-up in all process corners. A resistive shunt buffer interfaces the oscillator output to the dynamic divider. A differential output buffer drives a 50-Ω load. The separation of the oscillator core and divider/output buffer voltage supplies and grounds serves to maximize the isolation between the circuit blocks. The realized oscillator core die area is approximately 0.12 mm².

Figure 13:
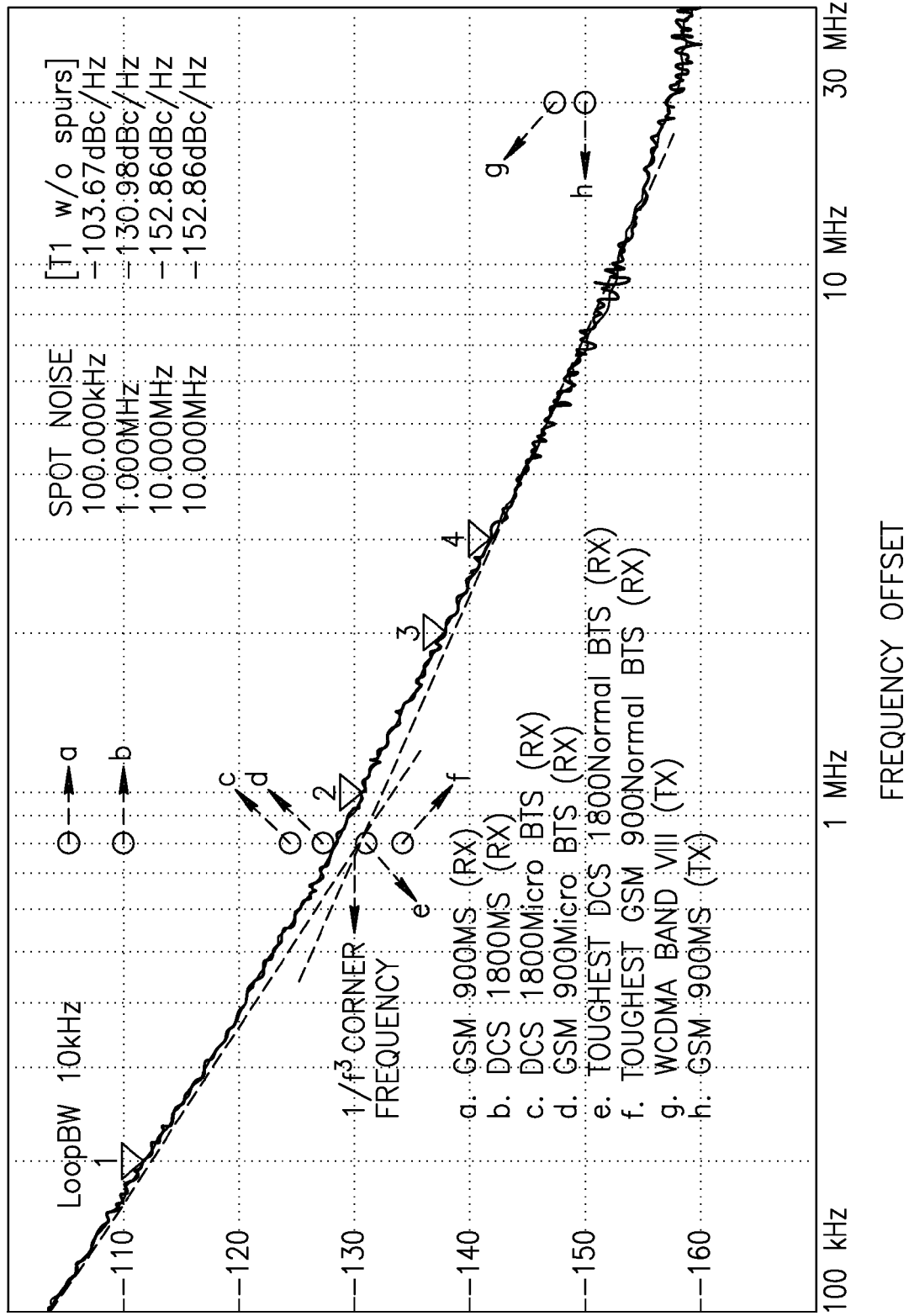
FIG. 13 is a graph illustrating the phase noise at 3.7 GHz and power dissipation of 15 mW.
Figure 14:
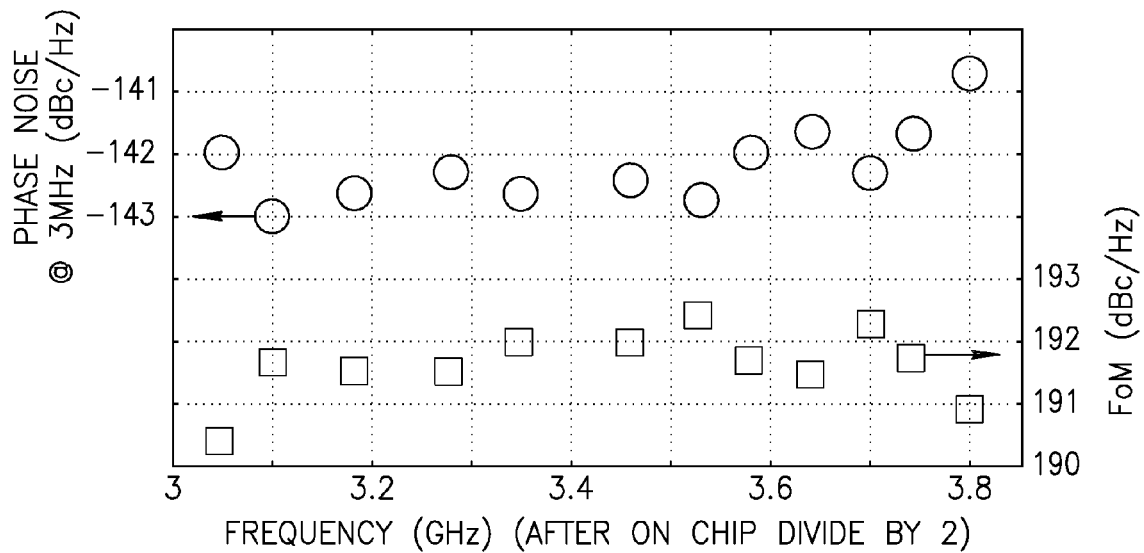
FIG. 14 is a graph illustrating the phase noise and figure of merit (FoM) at 3 MHz offset versus carrier frequency.
Figure 15:
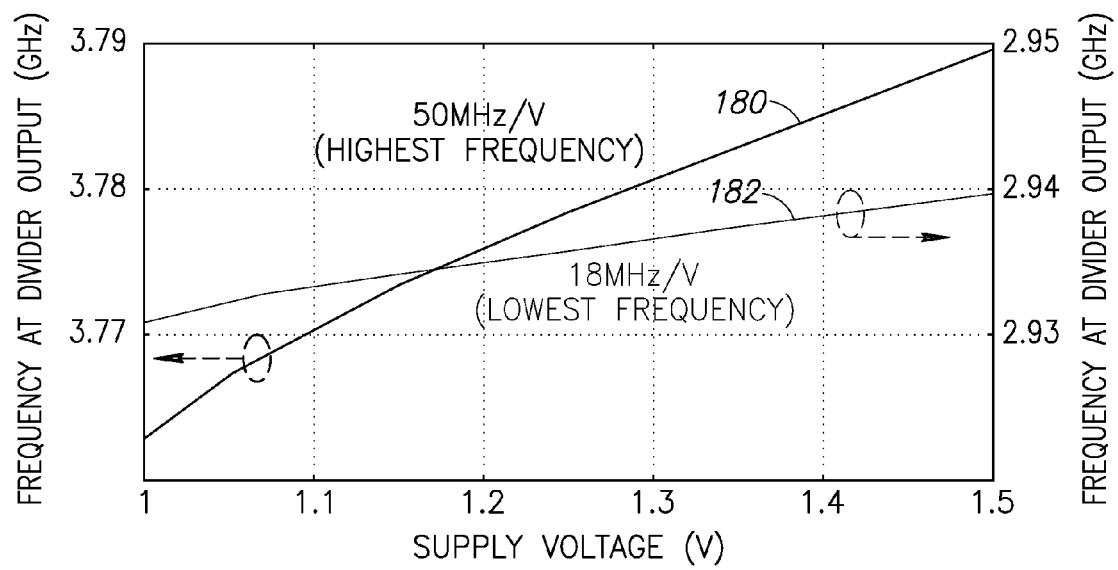
FIG. 15 is a graph illustrating frequency pushing due to supply voltage variation.

The measured phase noise at 3.7 GHz (after the on-chip÷2 divider) at 1.25 V and 12 mA current consumption is shown in FIG. 13. The phase noise of −142.2 dBc/Hz at 3 MHz offset lies on the 20 dB/dec slope, which extrapolates to −158.7 dBc/Hz at 20 MHz offset (−170.8 dBc/Hz when normalized to 915 MHz) and meets the GSM TX mobile station (MS) specification with a very wide 9 dB margin. The oscillation purity of the class-F oscillator is good enough to compare its performance to cellular base station (BTS) phase noise requirements. The GSM/DCS "Micro" BTS phase noise requirements are easily met. The phase noise, however, would be off by 3 dB for the toughest DCS-1800 "Normal" BTS specification at 800 kHz offset frequency. The 1/f3 phase noise corner is around 700 kHz at the highest frequency due to the asymmetric layout of the oscillator differential nodes further magnified by the dominance of parasitics in the equivalent tank capacitance. The 1/f3 phase noise corner moves to around 300 kHz at the middle and low part of the tuning range. The noise floor is −160 dBc/Hz and dominated by thermal noise from the divider and buffers. The oscillator has a 25% tuning range, from 5.9 to 7.6 GHz. FIG. 14 shows the average phase noise performance of four samples at 3 MHz offset frequency across the tuning range (after the divider), together with the corresponding FoM. The average FoM is as high as 192 dBc/Hz and varies about 2 dB across the tuning range. The divided output frequency versus supply is shown in FIG. 15 and reveals very low frequency pushing of 50 MHz/V and 18 MHz/V at the highest and lowest frequencies, respectively.

Figure 16A:
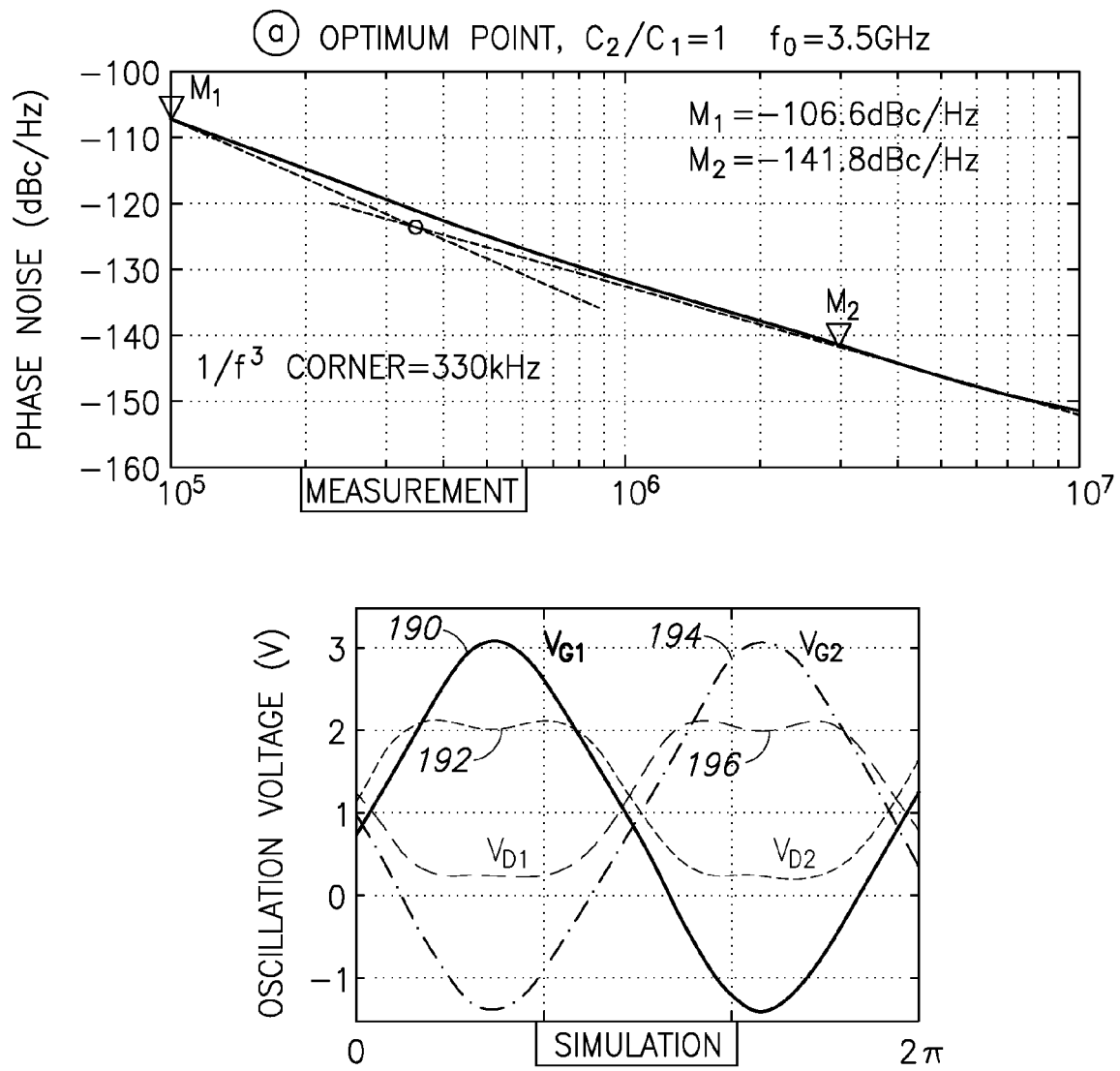
FIG. 16A is a graph illustrating optimum case phase noise at 3.5 GHz and oscillation waveforms.
Figure 16B:
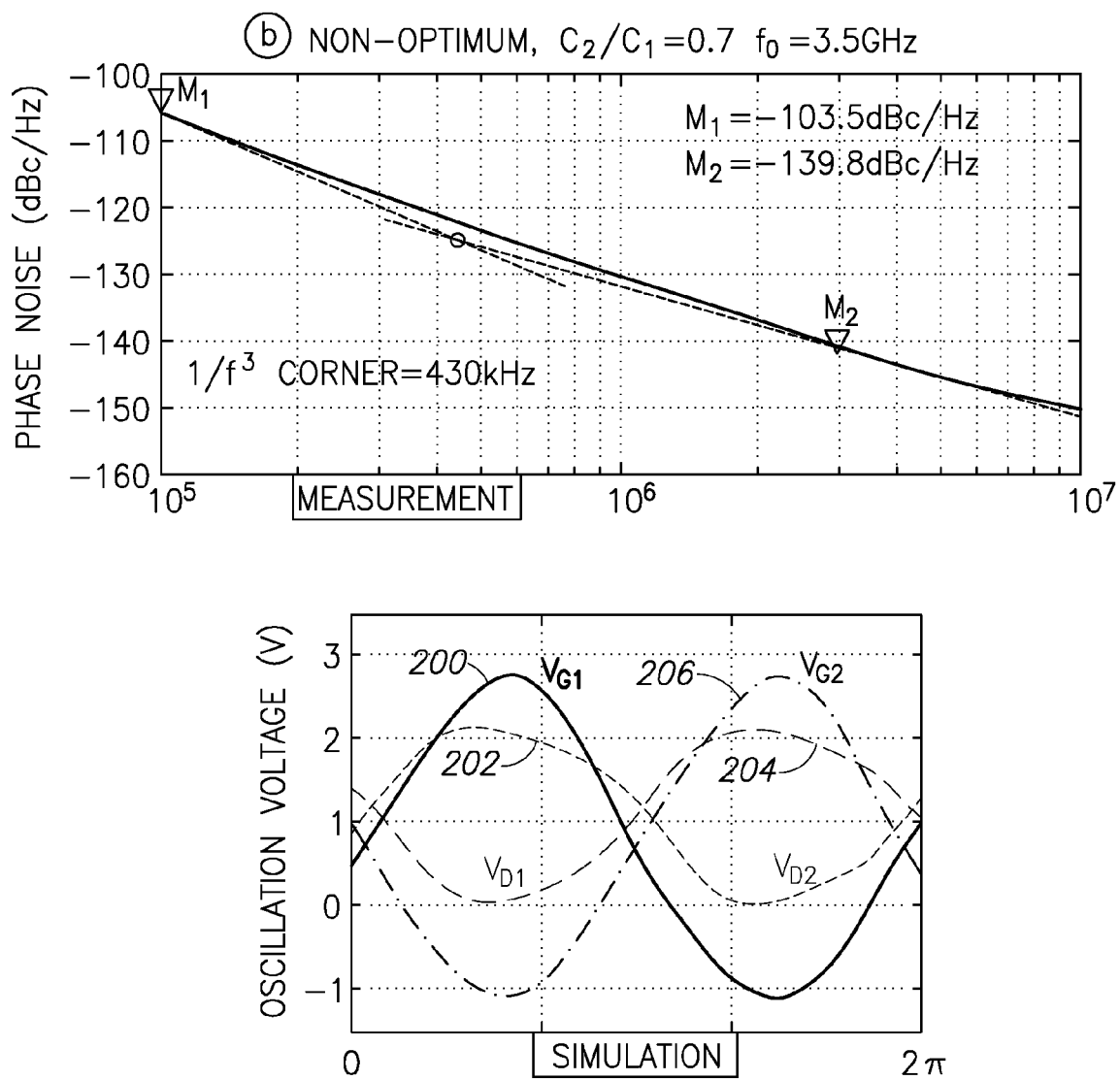
FIG. 16B is a graph illustrating non-optimum case phase noise at 3.5 GHz and oscillation waveforms.

The phase noise of the class-F oscillator was measured at the fixed frequency of 3.5 GHz for two configurations. In the first configuration, the $C_2/C_1$ ratio was set to one to align the second resonant frequency $\omega_2$ exactly at the $3^{rd}$ harmonic of the fundamental frequency $\omega_1$. This is the optimum configuration of the class-F oscillator (FIG. 16A). In the second configuration, the oscillation frequency is kept fixed but an unrealistically high 40% mismatch was applied to the $C_2/C_1$ ratio, which lowers $CO_2$, in order to see its effects on the phase noise performance (see FIG. 16B). As a consequence, the $3^{rd}$ harmonic component of the drain oscillation voltage is reduced and a phase shift can be seen between voltage waveform components at $3\omega_1$ and $\omega_1$. Therefore, its ISF rms value is worse than optimum, thus causing a 2 dB phase noise degradation in the 20 dB/dec region. In addition, the voltage waveform demonstrates more asymmetry in the rise and fall times, which translates to the non-zero ISF dc value and increases the upconversion factor of the 1/f noise corner of gm-devices. As can be seen in FIGS. 16A and 16B, the 1/f3 phase noise corner is increased by 25% or 100 kHz in the non-optimum case. This results in a 3 dB phase noise penalty in the flicker noise region.

circuit-to-phase noise conversion mechanisms of different oscillators' structures shows the class-F oscillator of the present invention exhibits the lowest phase noise at the same tank's quality factor and supply voltage. Based on this analysis, the inventors have constructed a class-F oscillator in 65-nm CMOS technology. The measurement results presented supra show that the oscillator achieves state-of-the-art

TABLE 3

Comparison of State-Of-The-Art Oscillators

|  | This Work | [9] | [8] | [30] | [10] | [31] | [2] | [19] |
|---|---|---|---|---|---|---|---|---|
| Technology | 65 nm | 130 nm | 350 μm | 65 nm | 55 nm | BiCMOS 130 nm | 90 nm | 65 nm |
| Supply voltage (V) | 1.25 | 1 | 2.5 | 1.2 | 1.5 | 3.3 | 1.4 | 0.6 |
| Frequency (GHz) | 3.7 | 5.2 | 1.2 | 3.92 | 3.35 | 1.56 | 0.915 | 3.7 |
| Tuning range (%) | 25 | 14 | 18 | 10.2 | 31.4 | 9.6 | 24.3 | 77 |
| Phase noise at 3 MHz (dBc/Hz) | −142.2 | −141.2 | −152 | −141.7 | −142 | −150.4 | −149 | −137.1 |
| Norm. phase noise[1] (dBc/Hz) | −154.3 | −147.5 | −154.8 | −154.4 | −153.3 | −155 | −149 | −149.21 |
| Power consumption (mW) | 15 | 1.4 | 9.25 | 25.2 | 27 | 290 | 25.2 | 10.5 |
| FoM (dB) | 192.2 | 195 | 195 | 189.9 | 189 | 180 | 184.6 | 188.7 |
| $FoM_T^2$ (dB) | 200.2 | 198.4 | 200.7 | 190 | 199 | 179.7 | 192.3 | 206.5 |
| Number of inductors/transformers | 1 | 1 | 2 | 2 | 1 | 1 | 1 | 1 |
| Oscillator structure | Class F | Class C | Noise Filtering | Clip-and-Restore | Class B/C | Colpitts | Traditional | Dual mode |

[1] phase noise at 3 MHz offset frequency normalized to 915 MHz carrier,
[2] $FoM_T = |PN| + 20 \log_{10}((f_0/\Delta f)(TR/10)) - 10 \log_{10}(P_{DC}/1\ mW)$ Table 3 above summarizes performance of the proposed class-F oscillator and compares it with the relevant state-of-the-art. The class-F demonstrates a 5 dB phase noise and 7 dB FoM improvements over the traditional commercial oscillator with almost the same tuning range. For the same phase noise performance range (−154 to −155 dBc/Hz) at 3 MHz offset for the normalized 915 MHz carrier, the class-F oscillator consumes only 15 mW, which is much lower than with Colpitts, class B/C and clip-and-restore topologies. Only the noise-filtering-technique oscillator offers a better power efficiency but at the cost of an extra dedicated inductor and thus larger die. Also, it uses a 2.5V supply thus making it unrealistic in today's scaled CMOS. From the FoM point of view, The class-C oscillator exhibits a better performance than the class-F oscillator. The voltage swing constraint in class-C, however, limits its phase noise performance. As can be seen, the class-F demonstrates more than 6 dB better phase noise with almost the same supply voltage. Consequently, the class-F oscillator has reached the best phase noise performance with the highest power efficiency at low voltage supply without the die area penalty of the noise-filtering technique or voltage swing constraint of the class-C VCOs.

Thus, the structure of LC-tank and oscillator circuit of the present invention introduces an impedance peak around the third harmonic of the oscillating waveform such that the third harmonic of the active device current converts into voltage and, together with the fundamental component, creates a pseudo-square oscillation voltage. The additional peak of the tank impedance is realized with a transformer-based resonator. As a result, the oscillator impulse sensitivity function reduces, thus lowering the conversion sensitivity of phase noise to various noise sources. Chief of these mechanisms arises when the active gm-devices periodically enter the triode region during which the LC-tank is heavily loaded while its equivalent quality factor is significantly reduced. The voltage gain, relative pole position, impedance magnitude and equivalent quality factor of the transformer-based resonator are quantified at its two resonant frequencies.

The secondary to the primary voltage gain of the transformer can be even larger than its turns ratio. A study of phase noise performance with the highest power efficiency at low voltage power supply without die area penalty or voltage swing constraint.

It is noted that although the description above has described third harmonic injection and realizing pseudo-square waveforms, second harmonic injection is also beneficial in improving the phase noise performance of the oscillator. The technique of second harmonic injection is similar to that of third harmonic injection described in detail supra.

Figure 17A:
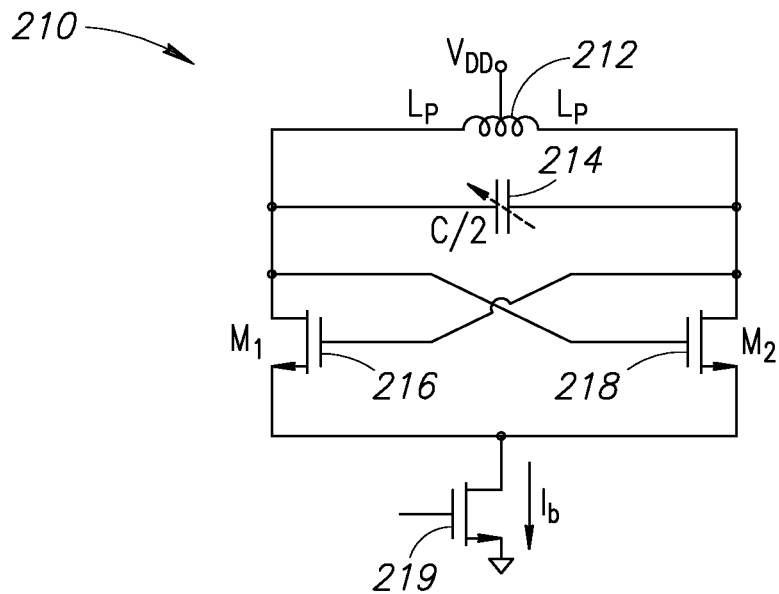
FIGS. 17A, 17B and 17C are diagrams illustrating the harmonic components of drain current.
Figure 17B:
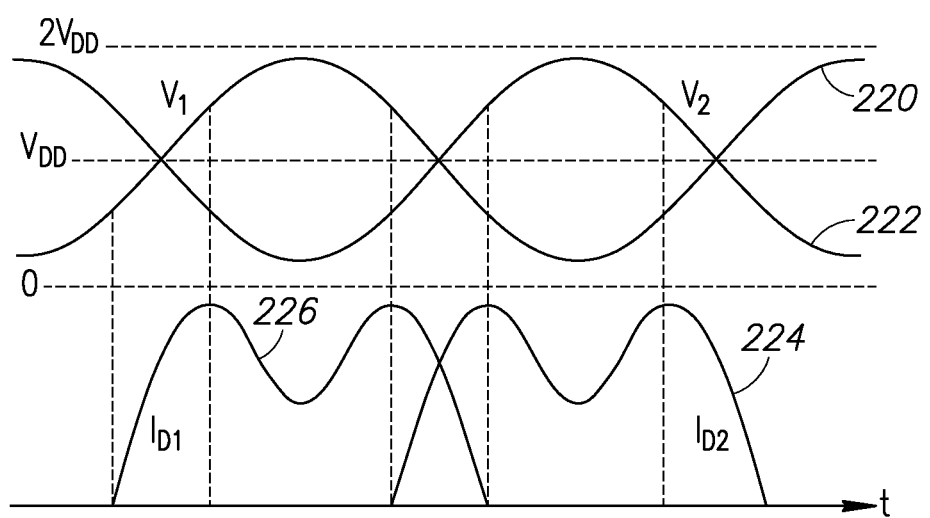
Figure 17C:
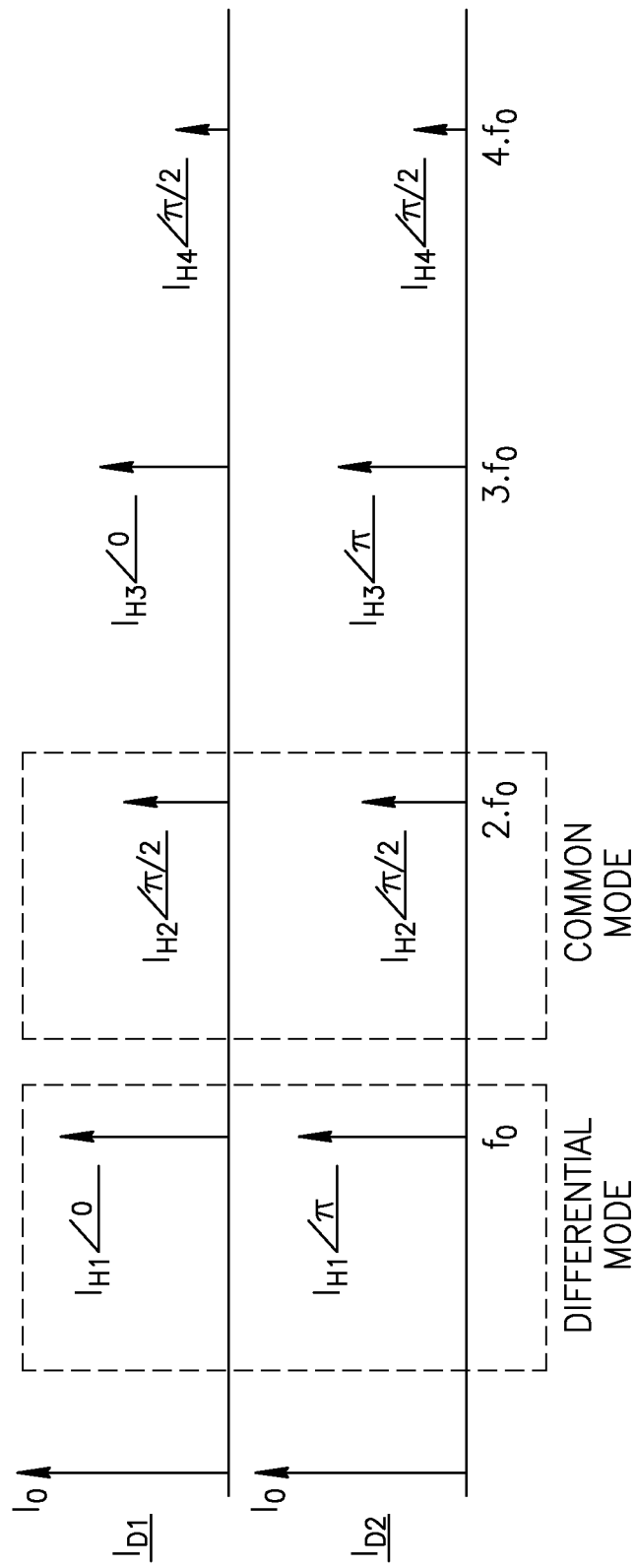
Figure 18:
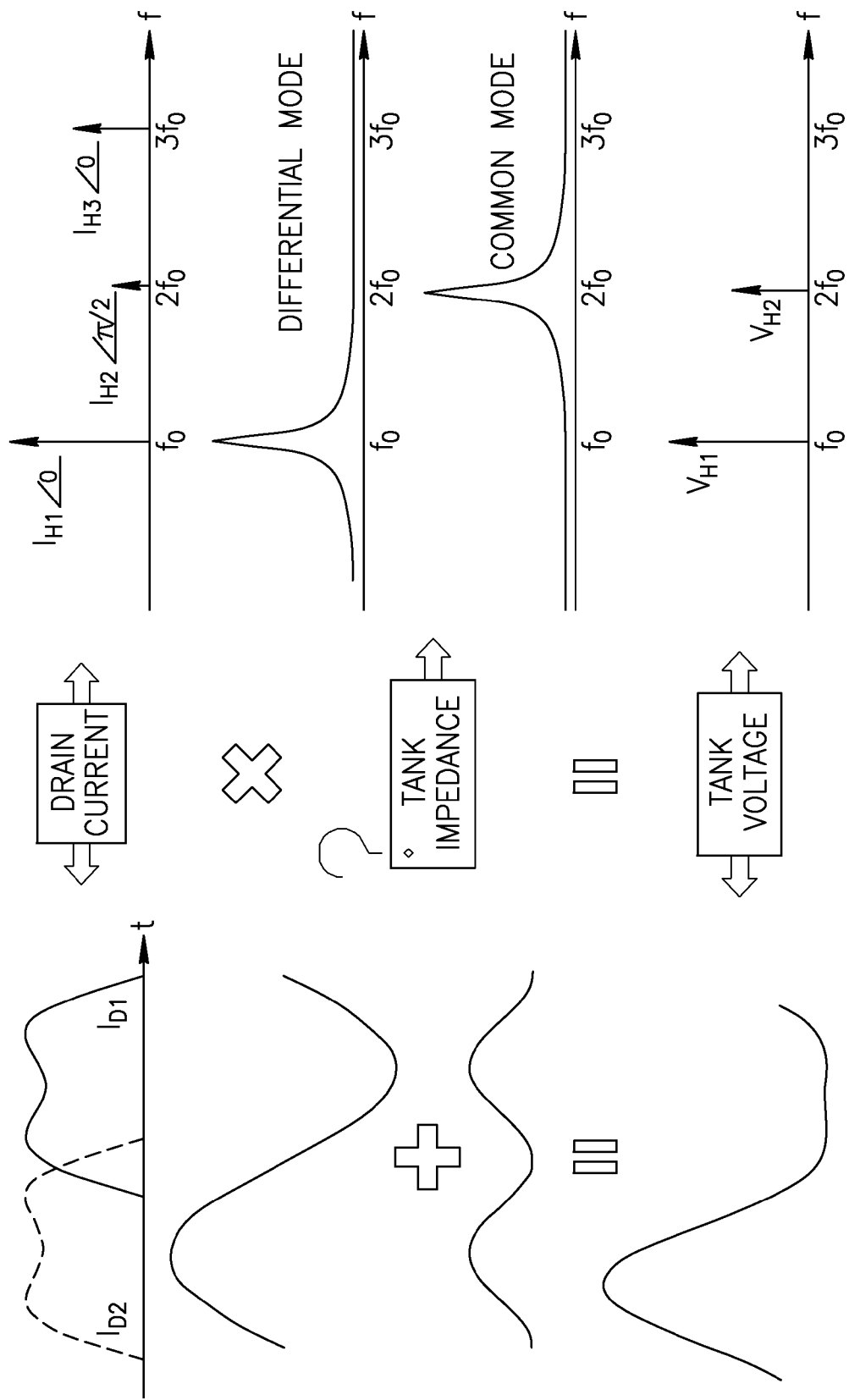
FIG. 18 is a diagram illustrating generating a special oscillation waveform.
Figure 19:
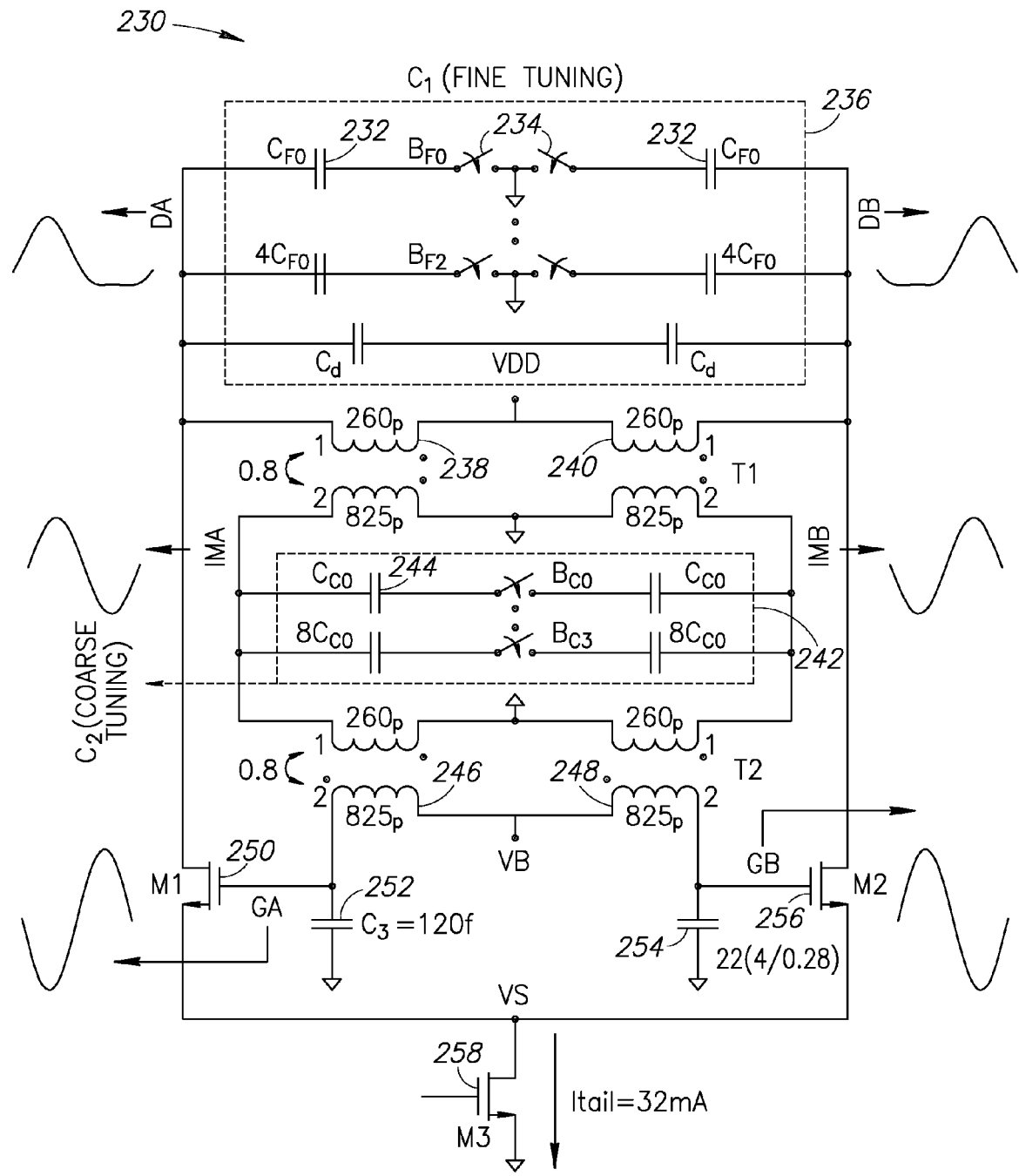
FIG. 19 is a schematic diagram illustrating an example embodiment of the oscillator of the present invention.
Figure 20:
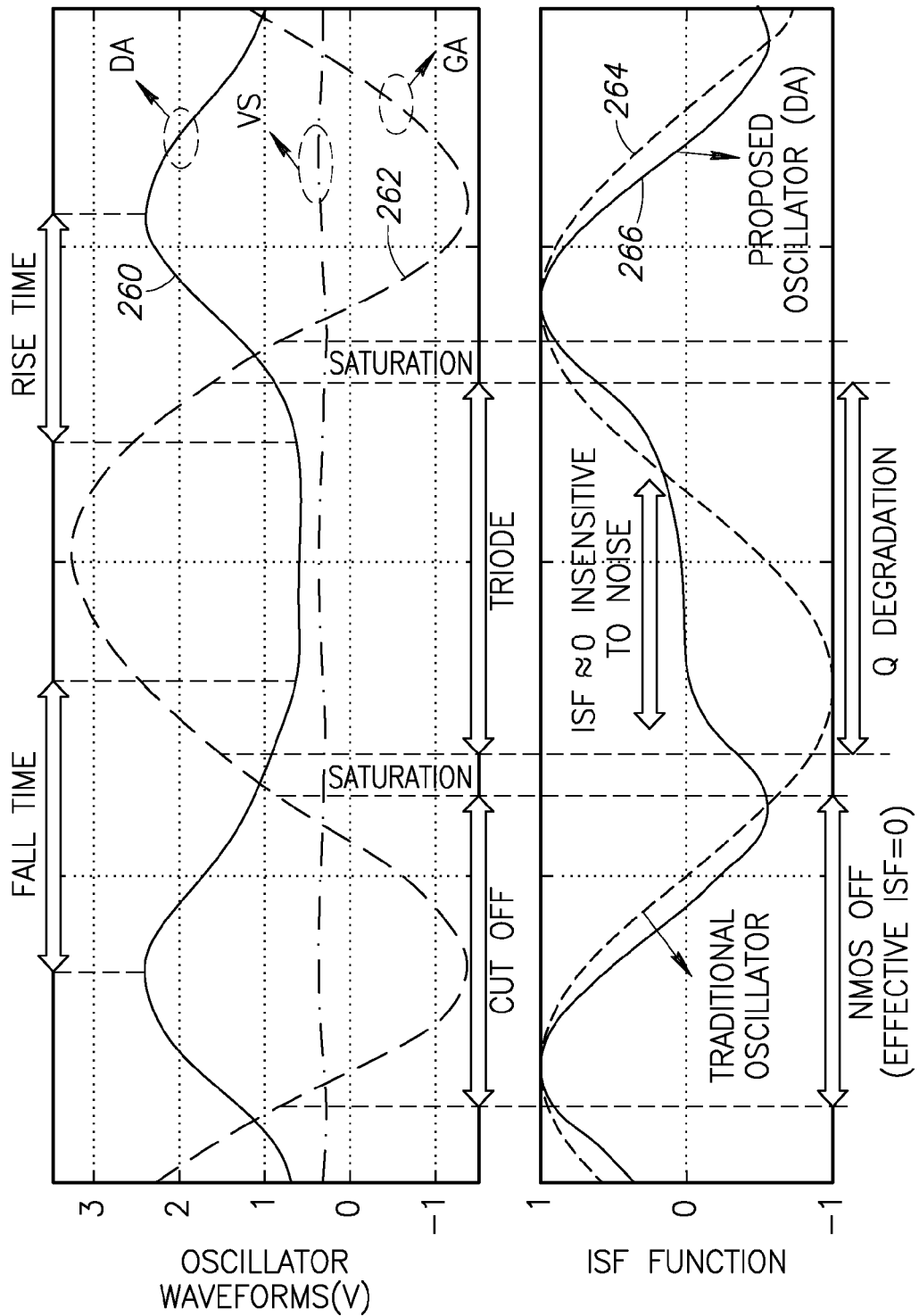
FIG. 20 is a diagram illustrating the oscillator waveforms and ISF of the oscillator of FIG. 19.

The technique of second harmonic injection is illustrated in FIGS. 17A, 17B and 17C which illustrate the harmonic components of drain current; FIG. 18 which a diagram illustrating generating a special oscillation waveform; FIG. 19 which is a schematic diagram illustrating an example embodiment of the oscillator of the present invention; and FIG. 20 which is a diagram illustrating the oscillator waveforms and ISF of the oscillator of FIG. 19.

An alternative embodiment of an RF oscillator is described infra. The resonating transformer structure features multiple resonating frequencies. Voltage gain is connected to an inverter that functions as a non-linear feedback amplifier to generate substantially rail-to-rail voltage waveform. The transformer filters and amplifies the driving voltage waveform.

Figure 21A:
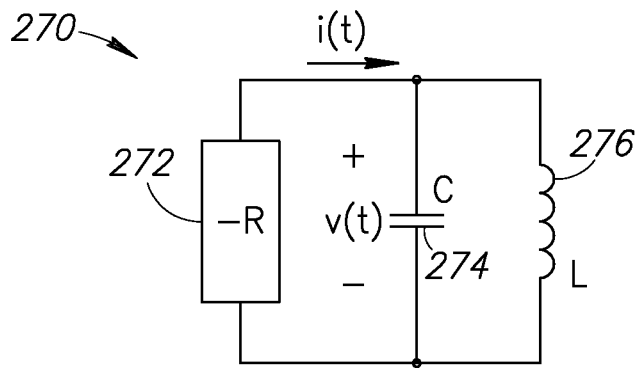
FIG. 21A is a diagram illustrating prior art LC-tank oscillator equivalent representation as one-port negative resistance.
Figure 21B:
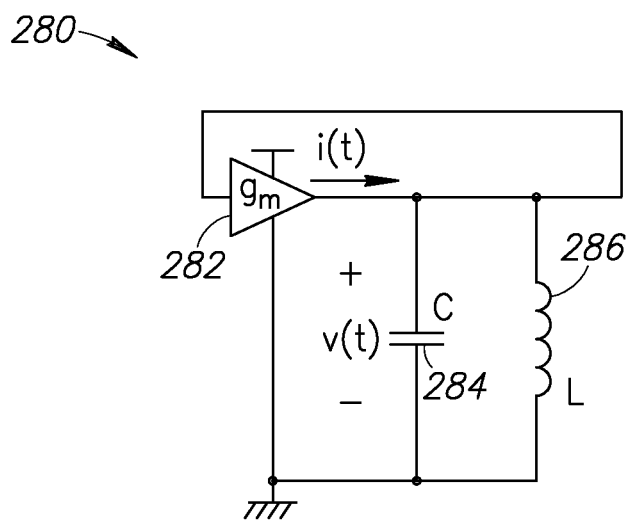
FIG. 21B is a diagram illustrating prior art LC-tank oscillator equivalent representation as two-port transconductance $g_m$.

A diagram illustrating prior art LC-tank oscillator equivalent representation as one-port negative resistance shown in FIG. 21A. A diagram illustrating prior art LC-tank oscillator equivalent representation as two-port transconductance $g_m$ shown in FIG. 21B. The traditional LC-tank oscillator, generally referenced 270, comprises a parallel LC-tank 274/276 that cycles the energy between the inductor L and the capacitor C. The oscillation frequency is established as 1/(2pi*sqrt(LC)). Since a practical LC-tank has non-zero losses, the energy will eventually dissipate as heat. Observing the voltage v(t) on the capacitor C, its amplitude will keep on diminishing. To perpetuate the oscillation, the diminishing oscillating voltage amplitude must increase the current injecting into the LC-tank, thus restoring the oscillating amplitude. This is most commonly realized as a negative resistance (e.g., cross-coupled transistor pair) or transconductance gain.

Building the negative resistance or transconductance is becoming more and more difficult in an advanced nanoscale CMOS technology. In addition, the current i(t) injection into the tank happens during intervals when the tank is sensitive to phase noise perturbations. This sensitivity is well-known as the impulse sensitivity function (ISF) and relates the effect of noise of i(t) on the phase (or zero-crossings) of the generated waveform.

Figure 22:
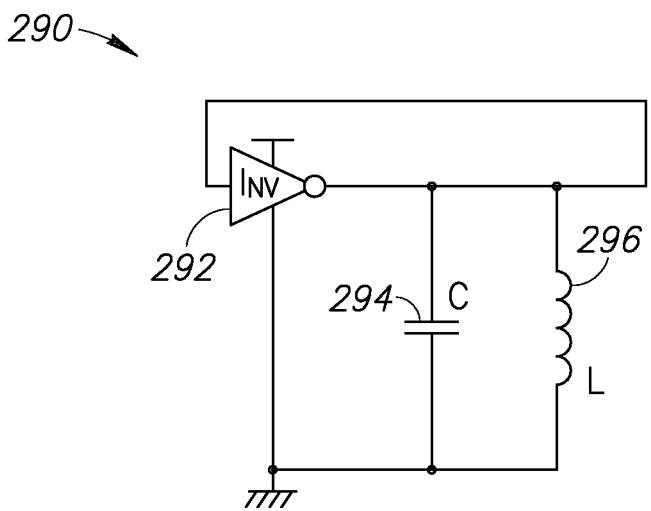
FIG. 22 is a diagram illustrating an inverter-based LC-tank oscillator.

Consequently, it is desirable to create an oscillator architecture that is amenable to the nanoscale CMOS process technology and minimize the ISF. A diagram illustrating an inverter-based LC-tank oscillator shown in FIG. 22. The oscillator circuit of FIG. 22, generally referenced 290, addresses the amenability with nanoscale CMOS technology. The transconductance gin is replaced with an inverter 292. Unfortunately, an inverter acts as a rail-to-rail voltage source rather than the current source. The generated waveform is rich in higher-order harmonics.

Figure 23A:
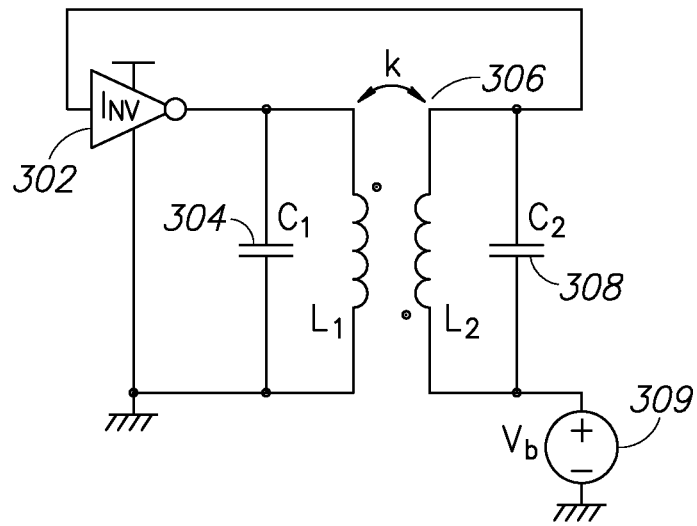
FIGS. 23A and 23B are diagrams illustrating a single-ended class-D LC-tank oscillator.
Figure 23B:
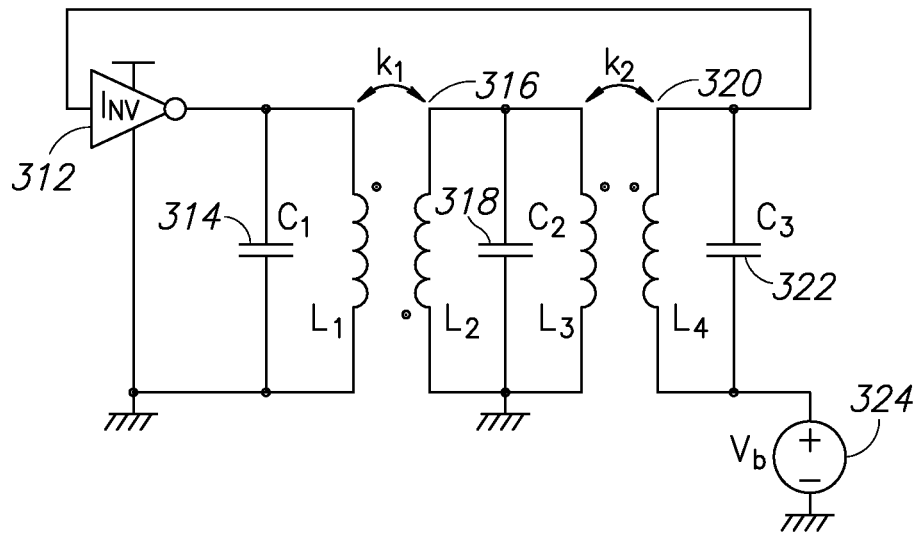

Diagrams illustrating a single-ended class-D LC-tank oscillator shown in FIGS. 23A and 23B. The oscillator, generally referenced 300, comprises a transformer 306 comprising two windings of inductances L1 and L2 is used instead of an inductor L. Instead of a capacitor C, two capacitors C1 304 and C2 308 in parallel with inductors L1 and L2 are used. The coupling coefficient between the two windings k is less than one, thus ensuring some amount of isolation. This isolation is needed for filtering of the higher-order harmonics. The inverter generates a rail-to-rail (Vdd–Vss) signal that is rich in odd harmonics. They are present at the primary winding (i.e. L1) of the transformer. The weakly-coupled secondary winding (i.e. L2) together with the parallel-connected capacitor C2 filters the higher-order odd harmonics thus ensuring that the generated signal being also the inverter input is substantially sinusoidal. It is beneficial for the transformer to have voltage gain (L2>L1) such that the slope of the inverter input is high. The bias voltage source Vb sets the voltage level close to the inverter threshold. In order to increase the isolation, thus improving the filtering, as well as to increase the voltage gain, two cascaded transformers could be used as shown in FIG. 23B.

Figure 24A:
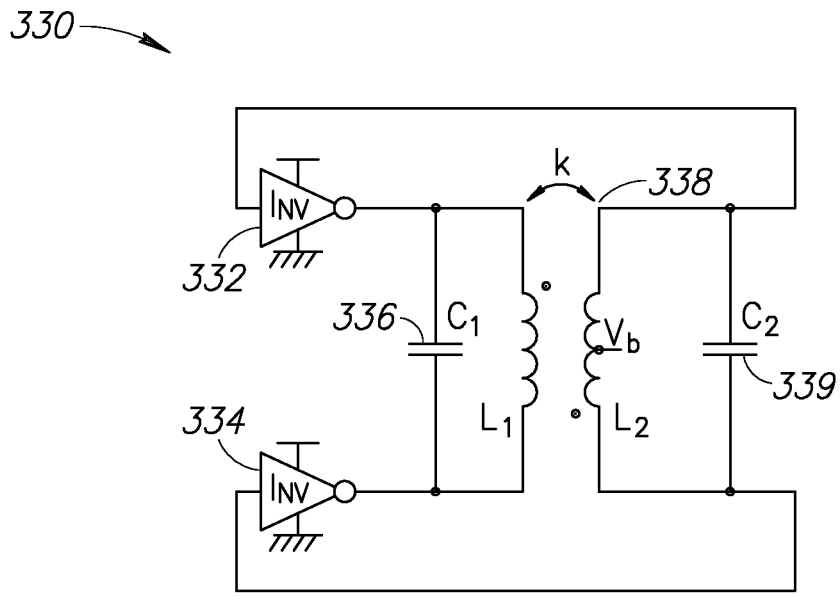
FIGS. 24A and 24B are diagrams illustrating a differential class-D LC-tank oscillator.
Figure 24B:
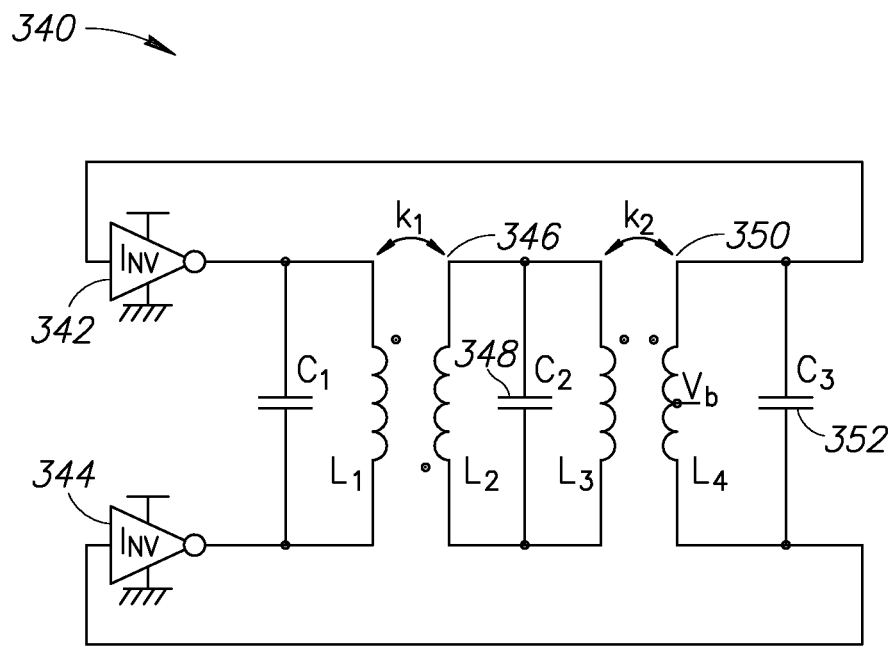

Diagrams illustrating a differential class-D LC-tank oscillator shown in FIGS. 24A and 24B. In another embodiment, the oscillator structure is made differential or pseudo-differential. The bias voltage Vb is connected to the center tap of the secondary winding (of the last transformer 350 in the two-transformer structure 340). It also ensures that the oscillation will be of differential-mode rather than the undesirable common-mode.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. An oscillator circuit, comprising:
   an active network having an input and an output, said active network operative to generate an active signal for sustaining the oscillation of said oscillator circuit;
   a passive differential network having an input and an output, said passive differential network including a transformer based tank circuit coupled to said active network and operative to generate a passive signal coupled to said active network input;
   wherein said differential passive network has a first input impedance magnitude peak at a first frequency $f_1$ and a second input impedance magnitude peak at a second frequency $f_2$; and
   wherein said oscillator circuit is operative to oscillate only at said first frequency.

2. The oscillator circuit according to claim 1, wherein said active network comprises one or more MOS transistors having a gate as its input and a drain as its output.

3. The oscillator circuit according to claim 1, wherein said first input impedance magnitude peak and said second input impedance magnitude peak cause an oscillation voltage to include significant harmonic component at said second frequency $f_2$ as well as at said first frequency $f_1$.

4. The oscillator circuit according to claim 1, wherein the magnetic coupling between said primary and secondary windings is substantially less than unity.

5. The oscillator circuit according to claim 1, further comprising a tunable capacitor coupled to said primary winding.

6. The oscillator circuit according to claim 1, further comprising a tunable capacitor coupled to said secondary winding.

7. The oscillator circuit according to claim 1, wherein said transformer comprises a center tap coupled to RF ground.

8. The oscillator circuit according to claim 7, further comprising a current source coupled to said active network.

9. The oscillator circuit according to claim 7, wherein said passive-differential network comprises two different conjugate pole pairs for realizing two different resonant frequencies.

10. The oscillator circuit according to claim 1, wherein said second frequency $f_2$ is substantially a harmonic of said first frequency $f_1$.

11. The oscillator circuit according to claim 10, wherein said harmonic ratio is approximately three.

12. The oscillator circuit according to claim 10, wherein said harmonic ratio is approximately two.

13. The oscillator circuit according to claim 1, wherein the gain of said passive network is higher than unity at said first frequency $f_1$.

14. The oscillator circuit according to claim 1, wherein gain of said passive network is lower than unity at said second frequency $f_2$.

15. The oscillator circuit according to claim 1, wherein said active signal is substantially a current.

16. The oscillator circuit according to claim 1, wherein said passive signal is substantially a voltage.

17. An oscillator circuit, comprising:
a pair of transistors for sustaining the oscillation of said oscillator circuit, said transistors each having a gate terminal and a drain terminal;
a transformer comprising a primary winding and a secondary winding, said primary winding coupled to both said drain terminals of said transistors, said secondary winding coupled to both said gate terminals of said transistors;
a first tunable capacitor coupled to said primary transformer winding;
a second tunable capacitor coupled to said secondary transformer winding;
wherein said oscillator exhibits a primary input impedance magnitude peak at a first resonant frequency $f_1$ and a secondary input impedance magnitude peak at a second resonant frequency $f_2$; and
wherein said oscillator circuit is operative to oscillate only at said first resonant frequency.

18. The oscillator circuit of claim 17, wherein said oscillator circuit comprises a transformer coupled class-F oscillator.

19. The oscillator circuit of claim 17, wherein the ratio of said second frequency $f_2$ to said first frequency $f_1$ is substantially an integer.

20. An oscillator circuit, comprising:
an active network having an input and an output, said active network operative to generate an active signal for sustaining the oscillation of said oscillator circuit;
a transformer based resonator differential tank circuit coupled to said active network and operative to generate a signal coupled to said active network input;
wherein said differential tank circuit has a primary input impedance magnitude peak at a first resonant frequency and a secondary input impedance magnitude peak at a second resonant frequency; and
wherein said oscillator circuit is operative to oscillate only at said first resonant frequency.

21. The oscillator circuit according to claim 20, wherein said tank circuit comprises one or more tuning capacitors.

22. The oscillator circuit according to claim 17, wherein said tank circuit comprises a transformer having a secondary winding and a primary winding, wherein said primary winding comprises a center tap coupled to $V_{DD}$ and said secondary winding comprises a center tap coupled to a bias voltage $V_B$.

23. The oscillator circuit according to claim 20, wherein the ratio of said second resonant frequency to said first resonant frequency is approximately three.

24. The oscillator circuit according to claim 20, wherein the ratio of said second resonant frequency to said first resonant frequency is approximately two.

25. The oscillator circuit according to claim 20, wherein said oscillator circuit operates in Class F operation by generating a pseudo-square voltage waveform due to third harmonic injection across said tank circuit.

26. The oscillator circuit according to claim 20, wherein said oscillator circuit operates in Class F operation by generating a clipped waveform due to second harmonic injection across said tank circuit.

27. A method of implementing an oscillator, the method comprising:
providing an active network having an input and an output, said active network operative to generate an active signal for sustaining the oscillation of said oscillator circuit;
providing a transformer based resonator differential tank circuit coupled to said active network, said tank circuit having a first differential resonant frequency corresponding to a first input impedance magnitude peak around a fundamental frequency and generating a signal coupled to said active network input;
increasing a substantially third harmonic component of the fundamental frequency in said tank circuit through a second differential resonant frequency thereof corresponding to a second input impedance magnitude peak around said third harmonic;
wherein said first input impedance magnitude peak and said second input impedance magnitude peak cause a pseudo-square oscillation voltage waveform on said tank circuit which includes significant harmonic component at said third harmonic frequency as well as at said fundamental frequency; and
wherein said oscillator circuit is operative to oscillate only at said first resonant frequency.

28. The method according to claim 27, wherein the introduction of said third harmonic in said tank circuit results in a reduced effective impulse sensitivity function (ISF) and reduced circuit noise contribution to the phase noise of said oscillator.

29. A method of implementing an oscillator, the method comprising:
providing an active network having an input and an output, said active network operative to generate an active signal;
providing a transformer based tank circuit coupled to said active network, said transformer based tank circuit having a first differential resonant frequency corresponding to a first input impedance magnitude peak around a fundamental frequency and generating a signal coupled to said active network input;
increasing a substantially second harmonic component of the fundamental frequency in said transformer based tank circuit through a second common-mode resonant frequency thereof corresponding to a second input impedance magnitude peak around said second harmonic; and
wherein said oscillator circuit is operative to oscillate only at said first resonant frequency.

30. The method according to claim 29, wherein the introduction of said second harmonic in said tank circuit results in a reduced effective impulse sensitivity function (ISF) and reduced circuit noise contribution to the phase noise of said oscillator.

31. An oscillator circuit, comprising:
a resonating transformer including a primary winding and a secondary winding for filtering and voltage amplifying a driving voltage waveform;
an inverter coupled to said resonating transformer and configured to function as a nonlinear feedback amplifier for generating said driving voltage waveform for sustaining the oscillation of said oscillator circuit;
wherein said oscillator circuit exhibits a first input impedance magnitude peak and a second input impedance magnitude peak wherein said voltage waveform includes significant harmonic component at a third harmonic frequency as well as at a fundamental frequency; and
wherein said oscillator circuit is operative to oscillate only at said fundamental frequency.

32. The oscillator circuit according to claim 31, wherein said driving voltage waveform is substantially a rail-to-rail waveform.

33. The oscillator circuit according to claim 31, wherein said inverter comprises a complementary inverter.

34. The oscillator circuit according to claim 31, wherein said primary winding and secondary winding are relatively weakly coupled having a coupling coefficient less than one.

* * * * *